United States Patent
Alivisatos et al.

(10) Patent No.: US 7,311,774 B2
(45) Date of Patent: *Dec. 25, 2007

(54) SHAPED NANOCRYSTAL PARTICLES AND METHODS FOR WORKING THE SAME

(75) Inventors: A. Paul Alivisatos, Oakland, CA (US); Eric C. Sher, Menlo Park, CA (US); Liberato Manna, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 357 days.

This patent is subject to a terminal disclaimer.

(21) Appl. No.: 10/980,472

(22) Filed: Nov. 2, 2004

(65) Prior Publication Data

US 2005/0109269 A1     May 26, 2005

Related U.S. Application Data

(62) Division of application No. 10/301,510, filed on Nov. 20, 2002, now Pat. No. 6,855,202.

(60) Provisional application No. 60/335,435, filed on Nov. 30, 2001.

(51) Int. Cl.
*C30B 29/62*     (2006.01)
(52) U.S. Cl. .............................. 117/68; 117/69; 117/70
(58) Field of Classification Search .................. 117/68, 117/69, 70
See application file for complete search history.

(56) References Cited

U.S. PATENT DOCUMENTS

| | | | |
|---|---|---|---|
| 4,625,071 A | 11/1986 | Delahoy et al. | |
| 5,262,357 A | 11/1993 | Alivisatos et al. | |
| 5,331,183 A | 7/1994 | Sariciftci et al. | |
| 5,350,459 A | 9/1994 | Suzuki et al. | |
| 5,350,644 A | 9/1994 | Graetzel et al. | |
| 5,454,880 A | 10/1995 | Sariciftci et al. | |
| 5,504,323 A | 4/1996 | Heeger et al. | |
| 5,505,928 A | 4/1996 | Alivisatos et al. | |

(Continued)

FOREIGN PATENT DOCUMENTS

WO     WO 99/00538 A1     1/1999

(Continued)

OTHER PUBLICATIONS

Abdou, Mohamed S. A., et al.; "Interaction of Oxygen with Conjugated Polymers: Charge Transfer Complex Formation with Poly(3-alkylthiophenes);" J. Am. Chem. Soc.; 1997; pp. 4518-4524; vol. 119; No. 19; American Chemical Society.

(Continued)

*Primary Examiner*—Robert Kunemund
(74) *Attorney, Agent, or Firm*—Townsend and Townsend and Crew LLP

(57) ABSTRACT

Shaped nanocrystal particles and methods for making shaped nanocrystal particles are disclosed. One embodiment includes a method for forming a branched, nanocrystal particle. It includes (a) forming a core having a first crystal structure in a solution, (b) forming a first arm extending from the core having a second crystal structure in the solution, and (c) forming a second arm extending from the core having the second crystal structure in the solution.

38 Claims, 12 Drawing Sheets

U.S. PATENT DOCUMENTS

| | | | |
|---|---|---|---|
| 5,523,555 | A | 6/1996 | Friend et al. |
| 5,525,440 | A | 6/1996 | Kay et al. |
| 5,537,000 | A | 7/1996 | Alivisatos et al. |
| 5,594,283 | A | 1/1997 | Bartel et al. |
| 5,670,791 | A | 9/1997 | Halls et al. |
| 5,698,048 | A | 12/1997 | Friend et al. |
| 5,751,018 | A | 5/1998 | Alivisatos et al. |
| 5,804,836 | A | 9/1998 | Heeger et al. |
| 5,847,787 | A | 12/1998 | Fredley et al. |
| 5,990,479 | A | 11/1999 | Weiss et al. |
| 6,013,871 | A | 1/2000 | Curtin |
| 6,207,392 | B1 | 3/2001 | Weiss et al. |
| 6,225,198 | B1 | 5/2001 | Alivisatos et al. |
| 6,261,779 | B1 | 7/2001 | Barbera-Guillem et al. |
| 6,277,740 | B1 | 8/2001 | Goldstein |
| 6,306,736 | B1 | 10/2001 | Alivisatos et al. |
| 6,423,551 | B1 | 7/2002 | Weiss et al. |
| 6,440,213 | B1 | 8/2002 | Alivisatos et al. |
| 6,855,202 | B2 | 2/2005 | Alivisatos et al. |
| 2002/0006723 | A1 | 1/2002 | Goldstein |
| 2002/0016306 | A1 | 2/2002 | Hutchison et al. |
| 2004/0146560 | A1* | 7/2004 | Whiteford et al. .......... 424/484 |
| 2005/0211154 | A1* | 9/2005 | Alivisatos et al. ............. 117/1 |

FOREIGN PATENT DOCUMENTS

| | | | |
|---|---|---|---|
| WO | WO 03/054953 A1 | 7/2003 | |

OTHER PUBLICATIONS

Ahmadi, et al., "Shape-Controlled Synthesis of Colloidal Platinum Nanoparticles," Science, vol. 272, pp. 1924-1926, (Jun. 28, 1996).

Alivisatos, "Semiconductor Cluster, Nanocrystals, and Quantum Dots," Science, vol. 271, pp. 933-937, (Feb. 16, 1996).

Alivisators, et al., "Organization of Nanocrystal Molecules' using DNA," Nature, vol. 382, pp. 609-611. (Aug. 15, 1996).

Arango, Alexi, et al.; "Efficient Titanium Oxide/Conjugated Polymer Photovoltaics for Solar Energy Conversion" Advanced Materials; Nov. 16, 2000; pp. 1689-1692; vol. 12; No. 22; Wiley-VCH Verlag GmbH; D-69469 Weinheim.

Ataev, et al., "Zinc Oxide Whiskers," Tech. Phys. Lett., vol. 23, No. 11, American Institute of Physics, pp. 842-843, (Nov. 1997).

Bach, U., et al.; "Solid-State Dye-Senitized Mesoporous TiO2 Solar Cells with High Photon-to Electron Conversion Efficiencies;" Nature; Oct. 8, 1998; pp. 853-585; vol. 395; Macmillan Publishers Ltd.

Bandaranayake, et al., "Structural Phase Behavior in II-VI Semiconductor Nanoparticles," Appl. Phys. Lett., vol. 67, No. 6, American Institute of Physics, pp. 831-833, (Aug. 7, 1995).

Berman, et al., "Total Alignment of Calcite at Acidic Polydiacetylene Films: Cooperativity at the Organic- Inorganic Interface," Science, vol. 269, pp. 515-518, (Jul. 28, 1995).

Bernal, et al., "X-Ray and Crystallographic Studies of Plant Virus Preparations," The Journal of General Physiology, vol. 25, No. 1, The Rockefeller Institute for Medical Research, pp. 111-165, (Sep. 20, 1941).

Braun et al., "Semiconducting Superlatices Templated by Molecular Assemblies," Nature, vol. 380, pp. 325-328, 1996.

Brus, "Quantum Crystallites and Nonlinear Optics," Applied Physics A, vol. 53, Springer-Verlag, pp. 465-474, (1991).

Buining, et al., "Isotropic-Nematic Phase Separation of a Dispersion of Organophillic Boehmite Rods," J. Phys. Chem., vol. 97, American Chemical Society, pp. 11510-11516, (1993).

Chandrasekhar, F.R.S., Liquid Crystals, Cambridge University Press, pp. 117-121, (1992).

Chang, et al., "The Shape Transition of Gold Nanorods," Langmuir, vol. 15, American Chemical Society, pp. 701-709, (1999).

Chartier, P., et al.; "Hybrid Organic-Inorganic Photovoltaic Junctions: Case of the All Thin-Film CdSe/poly93-methylthiophene) Junction;" Solar Energy Materials and Solar Cells; 1998; pp. 413-421; vol. 52; Elsevier Science B.V.

Chemseddine, et al., "Nanostructing Titania: Control over Nanocrystal Structure, Size, Shape, and Organization," Eur. J. Inorg. Chem., Wiley-VCH Verlag GmbH, pp. 235-245, (1999).

Chen, et al., Simple Solution-Phase Synthesis of Soluble CdS and CdSe Nanords, Chem. Mater., vol. 12, American Chemical Society, pp. 1516-1518, (2000).

Cho, "How Molecular Beam Epilaxy (MBE) Began and its Projection into the Future," Journal of Crystal Growth, 201/202, Elsevier Science B.V. pp. 1-7, (1999).

Colvin, et al., "Light-emitting Diodes Made from Cadmium Selenide Nanocrystals and a Semiconducting Polymer," Nature, vol. 370, pp. 354-357, (Aug. 4, 1994).

Cui, et al., "Nanowire Nanosensors for Highly Sensitive and Selective Detection of Biological and Chemical Species," Science, vol. 293, pp. 1289-1292, (Aug. 17, 2001).

Dabbousi, et al., "Electroluminescence from CdSe Quantum-Dot/Polymer Composites," Appl. Phys. Lett., vol. 66, No. 11, American Institute of Physics, pp. 1316-1318, (Mar. 13, 1995).

Dai, et al., "Synthesis and Characterization of Carbide Nanorods," Nature, vol. 375, pp. 769-772, (Jun. 29, 1995).

Dai, et al., "Synthesis and Optical Properties of Tetrapod-Like Zinc Oxide Nanorods," Chemical Physics Letters, vol. 358, Elsevier Science B.V., pp. 83-86, (May 24, 2002).

Davidson, et al., "Mineral Liquid Crystalline Polymers," Prog. Polym Sci., vol. 22, Elsevier Science Ltd., Graat Britain, pp. 913-936, (1997).

Dittmer, J J., et al.; "Crystal Network Formation in Organic Solar Cells;" Solar Energy Materials and Solar Cells; 2000; pp. 53-61; vol. 61; Elsevier Science B.V.

Dittmer, Janke, et al.; "Electron Trapping in Dye/Polymer Blend Photovoltaic Cells;" Advanced Materials; Sep. 1, 2000; pp. 1270-1274; vol. 12; No. 17; Wiley-VCH Verlag GmbH; D-69469 Weinheim.

Gabriel, et al., "New Trends in Colloidal Liquid Crystal Based on Mineral Moieties", Advanced Materials, vol. 12, No. 1, Wiley-VCH Verlag GmbH, pp. 9-20, (2000).

Gao, Jun, et al.; "Efficient Photodetectors and Photovoltaic Cells From Composites of Fullerenes and Conjugated Polymers: Photoinduced Electron Transfer," Synthetic Metals; 1997; pp. 979-980; vol. 84; Elsevier Science B.V.

Gao, Jun, et al.; "Polymer p-i-n Junction Photovoltaic Cells", Advanced Materials; 1998; pp. 692-695; vol. 10; No. 9; Wiley-VCH Verlag GmbH; D-69469 Weinheim.

Ginger, D. S., et al.; "Photoinduced Electron Transfer From Conjugated Polymers to CdSE Nanocrystals;" Physical Review B; Apr. 15, 1999; pp. 10622-10629; vol. 59; No. 16; The American Physical Society.

Granstrom, M., et al., "Laminated Fabrication of Plymeric Photovoltaic Diodes;" Nature; Sep. 17, 1998; pp. 257-260; vol. 395.

Granstrom, Magnus, et al.; "High Efficiency Polymer Photodiodes;" Synthetic Metals; 1999; pp. 957-958; vol. 102; Elsevier Science B.V.

Gratzel, Michael; Nanocrystalline Thin-Film PV Cells; Mrs Bulletin; 1993; pp. 61-66.

Greenham, N. C., et al.; "Charge Separation and Transport in Conjugated-Polymer/Semiconductor-Nanocrystal Composites Studied by Photoluminescence Quenching and Photoconductivity;" Physical Review B; Dec. 15, 1996; pp. 17628-17637; vol. 54; No. 24; The American Physical Society.

Halls, J. J. M., et al., "Charge- and Energy-Transfer Processes at Polymer/Polymer Interfaces: A joint Experimental and Theoretical Study;" Physical Review B; Aug. 15, 1999; pp. 5721-5726; vol. 60; No. 8; The American Physical Society.

Halls, J. J. M., et al.; "Efficient Photodiodes From Interpenetrating Polymer Networks;" Nature; Aug. 10, 1995; pp. 498-500; vol. 376.

Halls, J. J. M., et al.; "Exciton Diffusion and Dissociation in a Poly(P-Phenylenevinylene)/C60 Heterojuntion Photovoltaic Cell;" Appl. Phys. Lett.; May 27, 1996; pp. 3120-3122; vol. 68; No. 22; American Institute of Physics.

Halls, J. J. M., et al.; "The Photovoltaic Effect in a Poly(P-phenylenevinylene) / Perylene Heterojunction;" Synthetic Metals; 1997; pp. 1307-1308; vol. 85; Elsevier Science B.V.

Harrison, M. G., et al.; "Analysis of the Photocurrent Action Spectra of MEH-PPV Polymer Photodiodes;" Physical Review B; Mar. 15, 1997; pp. 7831-7849; vol. 55; No. 12; The American Physical Society.

Hiramoto, Masahiro, et al.; "Field-activated Structural Traps at Organic Pigment/Metal Interfaces Causing Photocurrent Multiplication Phenomena;" Applied Physics Letters; Nov. 2, 1998; pp. 2627-2629; vol. 73; No. 18.

Holmes, et al., "Control of Thickness and Orientation of Solution-Grown Silicon Nanowires," Science, vol. 287, pp. 1471-1473, (Feb. 25, 2000).

Horton, et al., Coexistence of Two Liquid Crystalline Phases in Poly(.gamma.-benzyl-.alpha., L -glutamate) Solutions, Nature, vol. 346, pp. 44-45, (Jul. 5, 1990).

Hu, et al., "Chemistry and Physics in One Dimension: Synthesis and Properties of Nanowires and Nanotubes," Acc. Chem. Res., vol. 32, No. 5, Accounts of Chemical Research, pp. 435-445, (1999).

Hu, et al., "Lineraly Polarized Emission from Colloidal Semiconductor Quantum Rods," Science, vol. 292, pp. 2060-2063, (Jun. 15, 2001).

Huang, S. Y., et al.; "Charge Recombination in Dye-Sensitized Nanocrystalline TiO2 Solar Cells;" J. Phys. Chem. B; 1997; pp. 2576-2582; vol. 101; American Chemical Society.

Huynh, et al., "CdSe Nanocrystal Rods/Poly3-hexylthiophene) Composite Photovoltaic Devices**," Advanced Materials, vol. 11, No. 11, Wiley-VCH Verlag GmbH, pp. 923-927, (1999).

Huynh, Wendy Ueyn; "Nanocrystal-Polymer Solar Cells;" May 2002; Dissertation U.C. Berkeley Chemistry Department.

Huynh, et al., "Hybrid Nanorod-Polymer Solar Cells," Science, vol. 295, pp. 2425-2427, (Mar. 25, 2002).

Ito, "Simple Criterion for Wurtzite-Zine-Blende Polytypism in Semiconductors," Jpn. J. Appl. Phys., vol. 37, Part 2, No. 10B, Publication Board, Japaneses Journal of Applied Physics, pp. L1217-L1220, (Oct. 15, 1998).

Jin, et al., "Photoinduced Conversion of Silver Nanospheres to Nanoprisms," Science, vol. 294, pp. 1901-1903, (Nov. 30, 2001).

Jun, et al., "Controlled Synthesis of Multi-armed CdS Nanorod Architectures Using Monosurfactant System," J. Am. Chem. Soc., vol. 123, American Chemical Society, pp. 5150-5151, (2002).

Kasem, K. K.; "Photo-electrochemistry at Polymer/Semiconductor Interface;" Journal of Material Science; 1999; pp. 5237-5242; vol. 34.

Kavan, Ladislav, et al.; "Quantum Size Efects in Nanocrystalline Semiconducting TiO2 Layers Prepared by Anodic Oxidative Hydrolysis of TiCl3;" J. Phys. Chem.; 1993; pp. 9493-9498; vol. 97; American Chemical Society.

Kohler, A., et al.; "Charge Separation in Localized and Delocalized Electronic Semiconducts;" Nature; Apr. 30, 1998; pp. 903-906; vol. 392.

Krasnikov, V.V., et al.; "Interpenetrating Morphologies for Photovoltaic Devices;" 1 page, no date, no pub.

Lee, "A Numerical Investigation of Nematic Ordering Based on a Simple Hard-rod Model," J. Chem. Phys., vol. 87, No. 8, American Institute of Physics, pp. 4972-4974, (1987).

Leon, et al., "Spatially Resolved Visible Luminescence of Self-Assembled Semiconductor Quantum Dots," Science, vol. 267, pp. 1966-1968, (Mar. 31, 1995).

Li, et al., "Coupled Synthesis and Self-Assembly of Nanoparticles to Give Structures with Controlled Organization," Nature, vol. 402, Macmillan Magazines Ltd., pp. 393-395, (Nov. 25, 1999).

Li, et al., "Band Gap Variation of Size- and Shape-Controlled Colloidal CdSe Quantum Rods," Nano Letters, vol. 1, No. 7, American Chemical Society, pp. 349-351, (2001).

Li, et al., "Semiconductor Nanorod Liquid Crystals," Nano Letters, vol. 2, No. 6, the American Chemical Society, pp. 557-560, (Jun. 2002).

Li, Yongxiang, et aL; "Novel Photoelectrochromic Cells Containing a Polyaniline Layer and a Dye-Sensitized Nanocrystalline TiO2 Photovoltaic Cell;" Synthetic Metals; 1998; pp. 273-277; vol. 94; Elsevier Science B.V.

Lieber, "One-Dimensional Nanostructures: Chemistry, Physics & Applications," Solid State Communications, vol. 107, No. 11, Elsevier Science Ltd., pp. 607-616, (1998).

Liu, et al., "Strain Evolution in Coherent Ge/Si Islands," Physical Review Letters, vol. 84, No. 9, The American Physical Society, pp. 1958-1961, (Feb. 28, 2000).

Loweth, et al., "DNA-Based Assembly of Gold Nanocrystals", Angew, Chem. Int. Ed., vol. 38, No. 12., Wiley-VCH Verlag GmbH, pp. 1808-1812, (1999).

Manna, Liberato, et al.; "Synthesis of Soluble and Processable Rod-, Arrow, Teardrop-, a Tetrapod-Shaped CdSe Nanocrystals;" J. Am. Chem. Soc.; 2000; pp. 12700-12706; vol. 122; No. 51.

Marks, R. N., et al.; "The Photovoltaic Response in Poly(p-phenylene vinylene) Thin-Film Devices;" Phys.: Condens. Matter; 1994; pp. 13797-1394; vol. 6; IOP Publishing Ltd.; United Kingdom.

Mews, et al., "Structural and Spectroscopic Investigations of CdS/HgS/CdS Quantum-Dot Quantum Wells," Physical Review B, vol. 53, No. 20, The American Physical Society, pp. R13 242-R13 245, (May 15, 1996).

Mirkin, et al., "A DNA-based Method for Rationally Assembling Nanoparticles into Macroscopic Materials," Nature, vol. 382, pp. 607-609, (Aug. 15, 1996).

Murray, et al., "Synthesis and Characterization of Nearly Monodisperse CdE (E=S, Se, Te) Semiconductor Nanocrystallites," J. Am. Chem. Soc., American Chemical Society, pp. 8706-8715, (1993).

Murray, et al., "Self-ORganization of CdSe Nanocrystallites into Three-Dimensional Quantum Dot Superlattice," Science, vol. 270, pp. 1335-1338, (Nov. 24, 1995).

Nazeeruddin, M. K., et al.; "Conversion of Light to Electricity by cis-X2Bis(2,2'-bipyridyl-4,4'-dicarboxylate)ruthenium(II) Change-Transfer Sensitizers (X=Cl-, Br-, I-, CN-, and SCN-) on Nanocrystalline TiO2 Electrodes;" J. Am. Chem. Soc.; 1993; pp. 6382-6390; vol. 115.

Ni, et al., "Fabrication and Characterization of the Plate-Shaped .gamma.-Fe.sub.2 O.sub.3 Nanocrystals," Chem. Mater., vol. 14, American Chemical Society, pp. 1048-1052, (2002).

O'Regan, Brian, et al.; "A Low-Cost, High-Efficiency Solar Cell Based on Dye-Sensitized Colloidal TiO2 Films;" Nature; Oct. 24, 1991; pp. 737-740; vol. 353.

Ouali, Lahoussine, et al.; "Oligo(phenylenevinylene)/Fulierene Photovoltaic Cells: Influence of Morphology", Advanced Materials; 1999.

Park, et al., "Structural and Electronic Properties of Cubic, 2H, 4H, and 6H SiC," Physical Review B, vol. 49, No. 7, The American Physical Society, pp. 4485-4493, (Feb. 15, 1994).

Park, J. Y., et al.; "The Electroluminescent and Photodiode Device Made of a Polymer Blend;" Synthetic Metals; 1996; pp. 177-181; vol. 79; Elsevier Science B.V.

Park, et al., "Synthesis and Magnetic Studies of Uniform Iron Nanorods and Nospheres," J. Am. Chem. Soc. vol. 122, American Chemical Society, pp. 8581-8582, (2000).

Paul, "Silicon-Germanium Strained Layer Materials in Microelectronics**," Advanced Materials, vol. 11, No. 11, Wiley-VCH Verlag GmbH, pp. 191-204, (1999).

Peng, et al., "Kinetics of II-VI and III-V Colloidal Semiconductor Nanocrystal Growth: "Focusing" of Size Distributions," J. Am. Chem Soc., vol. 120, American Chemical Society, pp. 5343-5344, (1998).

Peng, et al., "Shape Control of CdSe Nanocrystals," Nature, vol. 404, Macmillan Magazines Ltd., pp. 59-61, (Mar. 2, 2000).

Peng, et al., Formation of High-Quality CdTe, CdSe, CdS Nanocrystals Using CdO as Precursor, J. Am. Chem. Soc., vol. 123, American Chemical Society, pp. 183-184, (2001).

Peng, et al., "Nearly Monodisperse and Shape-Controlled CdSe Nanocrystals via Alternative Routes: Nucleation and Growth," J. Am. Chem. Soc., vol. 124, American Chemical Society, pp. 3343-3353, (2002).

Peng, Xiaogang; "High Quality Inorganic Semiconductor Nanocrystals for New Solar Cells;" pp. 1-8, no date no publication.

Penn, et al., "Imperfect Oriented Attachment: Dislocation Generation in Defect-Free Nanocrystals," Science, vol. 281, pp. 969-971, (Aug. 14, 1998).

Petritsch, K., et al.; "Dye-Based Donor/Acceptor Solar Cells;" Solar Energy Materials and Solar Cells; 2000; pp. 63-72; vol. 61; Elsevier Science B.V.

Puntes, et al., "Colloidal Nanocrystal Shape and Size Control: The Case of Coblat," Science, vol. 291, pp. 2115-2117, (Mar. 16, 2001).

Qi, et al., "Reverse Micelle Based Formation of $BaCO_3$ Nanowires," J. Phys. Chem. B, vol. 101, American Chemical Society, pp. 3430-3463, (1997).

Rees, et al., "Formation and Morphology of Calcium Sulfate Nanoparticles and Nanowires in Water-in-Oil Microemulsions," vol. 15, American Chemical Society, pp. 1993-2002, (1999).

Roman, Lucimara Stolz, et al.; "Trapping Light in Polymer Photodiodes with Soft Embossed Gratings", Advanced Materials; 2000; pp. 189-195; vol. 13; Issue. 3.

Roman, Lucimara, et al.; "High Quantum Efficiency Polythiophene/C60 Photodiodes;" Advanced Materials; 1998; pp. 774-777; vol. 10; No. 10; Wiley-VCH Verlag GmbH; D-69469 Weinheim.

Roman, Lucimara, et al.; "Photodiode Performance and Nanostrusture of Polythiophene/C60 Blends**;" Advanced Materials; 1997; pp. 1164-1168; vol. 9; No. 15; Wiley-VCH Verlag GmbH; D-69469 Weinheim.

Satoh, et al., "Expitaxial Growth of Zinc Oxide Whiskers by Chemical-Vapor Deposition under Atmospheric Pressure," Jpn. J. Appl. Phys., vol. 38, Part 2, No. 5B, Publication Board, Japanese Journal of Applied Physics, pp. L586-L589. (May 15, 1999).

Schlamp M. C., et al.; "Improved Efficiencies in Light Emitting Diodes Made with CdSe(CdS) core/shell type Nanocrystals and a Semiconducting Polymer;" J. Appl. Phys.; Dec. 1, 1997; pp. 5837-5842; vol. 82; No. 11; American Institute of Physics.

Schmid, "Large Clusters and Colloids. Metals in the Embryonic State," Chem. Rev., vol. 92, American Chemical Society, pp. 1709-1727, (1992).

Schmidt-Mende, L., et al.; "Self-Organized Discotic Liquid Crystals for High-Efficiency Organic Photovoltaics;" Reports; Apr. 17, 2001; 4 pages.

Schon, J. H., et al.; "Efficient Organic Photovoltaic Diodes Based on Doped Pentacene;" Nature; Jan. 27, 2000; pp. 408-410; vol. 403.

Shaheen, Sean, et al.; "2.5% Efficient Organic Plastic Solar Cells;" Applied Physics Letters; Feb. 5, 2001; pp. 841-843; vol. 78; No. 6; American Insitute of Physics.

Sharma, Sachin Kr., et al.; "CdSe Photovaltaic Sintered Films;" Optical Materials; 1999; pp. 261-265; vol. 13; Elsevier Science B.V.

Shevchenko, et al., "Colloidal Crystals of Monodisperse FePt Nanoparticles Grown by a Three-Layer Technique of Controlled Oversaturation", Advanced Materials, vol. 14, No. 4, Wiley-VCH Verlag GmbH, pp. 287-290, (Feb. 19, 2002).

Sirringhaus, Henning, et al.; "Integrated Optoelectronic Devices Based on Conjugated Polymers;" Science; Jun. 12, 1998; pp. 1741-1744; vol. 280.

Smalley, et al., "The Future of the Fullerenes," Solid State Communications, vol. 107, No. 11, Elsevier Science Ltd., pp. 597-606, (1998).

Smestad, Greg P., et al.; "Demonstrating Electron Transfer and Nanotechnology: A Natural Dye-Sensitized. Nanocrystalline Energy Converter," Journal of Chemical Education; Jun. 5, 1998; pp. 752-756; vol. 75.

Sonin, "Inorganic Lyotropic Liquid Crystals;" J. Mater. Chem., vol. 8, pp. 2557-2574, (1998).

Steigerwald, et al., "Surface Derivatization and Isolation of Semiconductor Cluster Molecules," J. Am. Chem. Soc., vol. 110, American Chemical Society, pp. 3046-3050, (1988).

Strzelecka, et al., "Multiple Liquid Crystal Phases of DNA at High Concentrations," Nature, vol. 331, pp. 457-460, (Feb. 4, 1988).

Tada, K., et al.; "Donor Polymer (PAT6)—Acceptor Polymer (CNPPV) Fractal Network Photocells;" Synthetic Metals; 1997; pp. 1305-1306; vol. 85; Elsevier Science B.V.

Tada, Kazuya, et al.; "Characteristics of Poly(p-pyridyl vinylene)/Poly(3-alkylthiophene) Heterojuntion Photocell;" Jpn. J Appl. Phys.; Mar. 1, 1997; pp. 306-309; vol. 36 Pt. 2; No. 3A.

Tang, C. W.; "Two-Layer Organic Photovoltaic Cell;" Appl. Phys. Lett.; Jan. 13, 1986; pp. 183-185; vol. 48; No. 2; American Institute of Physics.

Tanori, et al., "Control of the Shape of Copper Metallic Particles by Using a Colloidal System as Template," Langmuir, vol. 13, American Chemical Society, pp. 639-646, (1997).

Trentler, et al., "Solution-Liquid-Solid Growth of Crystalline III-V Semiconductors: An Analogy to Vapor-Liquid-Solid Growth," Science, vol. 270, pp. 1791-1794, (Dec. 15, 1995).

Vogel, R., et al.; "Quantum-Sized PbS, CdS, Ag2S, Sb2S3 and Bi2S3 Particles as Sensitizers for Various Nanoporous Wide-Bandgap Semiconductos;" J. Phys. Chem.,; 1994; pp. 3183-3188; vol. 98; American Chemical Society.

Vroege, et al., "Phase Transitions in Lyotropic Colloidal and Polymer Liquid Crystals," Rep. Prog. Phys, vol. 55, IOP Publishing Ltd., UK, pp. 1241-1309, (1992).

Wang, et al., "Highly Polarized Photoluminescence and Photodetection from Single Indium Phosphide Nanowires," Science, vol. 293, pp. 1455-1457, (Aug. 24, 2001).

Winiarz, Jeffrey, et al.; "Photogenertion, Charge Transport and Photoconductivity of a Novel PVK/CdS-Nanocrystal Polymer Composite;" Chemical Physics; 1999; pp. 417-428; vol. 245; Elsevier Science B.V.

Yeh, et al., "Predictions and Systematization of the Zinc-Blende-Wurtzite Structural Energies in Binary Octet Compounds," Physical Review B, vol. 45, No. 20, The American Physical Society, pp. 12 130-12 133, (May 15, 1992).

Yeh, et al., "Zinc-blende-Wurtzite Polytypism in Semiconductors," Physical Review B, vol. 46, No. 16, The American Physical Society, pp. 10 086-10 097, (Oct. 15, 1992).

Yoshino, Katsumi, et al.; "Novel Photovoltaic Devices Based on Donor-Acceptor Molecular and Conducting Polymer Systems;" IEEE Transactions on Electron Devices; Aug. 8, 1997; pp. 1315-1324; vol. 44; No. 8; IEEE.

Yu, G., et al.; "Charge Separation and Photovoltaic Conversion in Polymer Composites with Internal Donor/Acceptor Heterojuntions;" J. Appl. Phys.; Oct. 1, 1995; pp. 4510-4515; vol. 78; No. 7; American Institute of Physics.

Yu, G., et al.; "Dual-Function Semiconducting Polymer Devices: Light-emitting and Photodetecting Diodes;" Appl. Phys. Lett.; Mar. 21, 1994; vol. 64; No. 12; American Institute of Physics.

Yu, G., et al.; "Polymer Photovoltaic Cells: Enhanced Efficiencies via a Network of Internal Donor-Acceptor Heterojunctions;" Science; Dec. 15, 1995; pp. 1789-1791; vol. 270.

Yu, G., et al.; "Semiconducting polymer Diodes: Large Size, Low Cost Photodetectors with Excellent Visible-Ultraviolet Sensitivity;" Appl. Phys. Lett.; Jun. 20, 1994; pp. 3422-3423; vol. 64; No. 25; American Institute of Physics.

Yu, et al., "Gold Nanorods: Electrochemical Synthesis and Optical Properties," The Journal of Physical Chemistry B, vol. 101, No. 34, American Chemical Society, pp. 6661-6664, (Aug. 21, 1997).

Zaban, A., et al.; "Photosensitization of Nanoporous TiO2 Electrodes with InP Quantum Dots;" Langmuir; 1998; pp. 3153-3156; vol. 14; American Chemical Society.

Zhang, Fangling, et al.; "Soluble Polythiophenes With Pendant Fullerene Groups as Double Cable Matersals for Photodiodes**;" Advanced Materials; 2001; pp. 1871-1874; vol. 13; No. 24; Wiley-VCH Verlag GmbH; D-69469 Weinheim.

Zhou, et al., "A New Method for Preparation of Zinc Oxide Whiskers," Materials Research Bulletin, vol. 34, No. 10/11, Elsevier Science Ltd., pp. 1563-1567, (1999).

Zhou, et al., Studies on the Strength and Wear Resistance of Tetrapod-Shaped ZnO Whisker-Reinforced Rubber Composites, Journal of Applied Polymer Science, vol. 80, John Wilay & Sons, Inc., pp. 1520-1525, (2001).

* cited by examiner 10 nm 10 nm

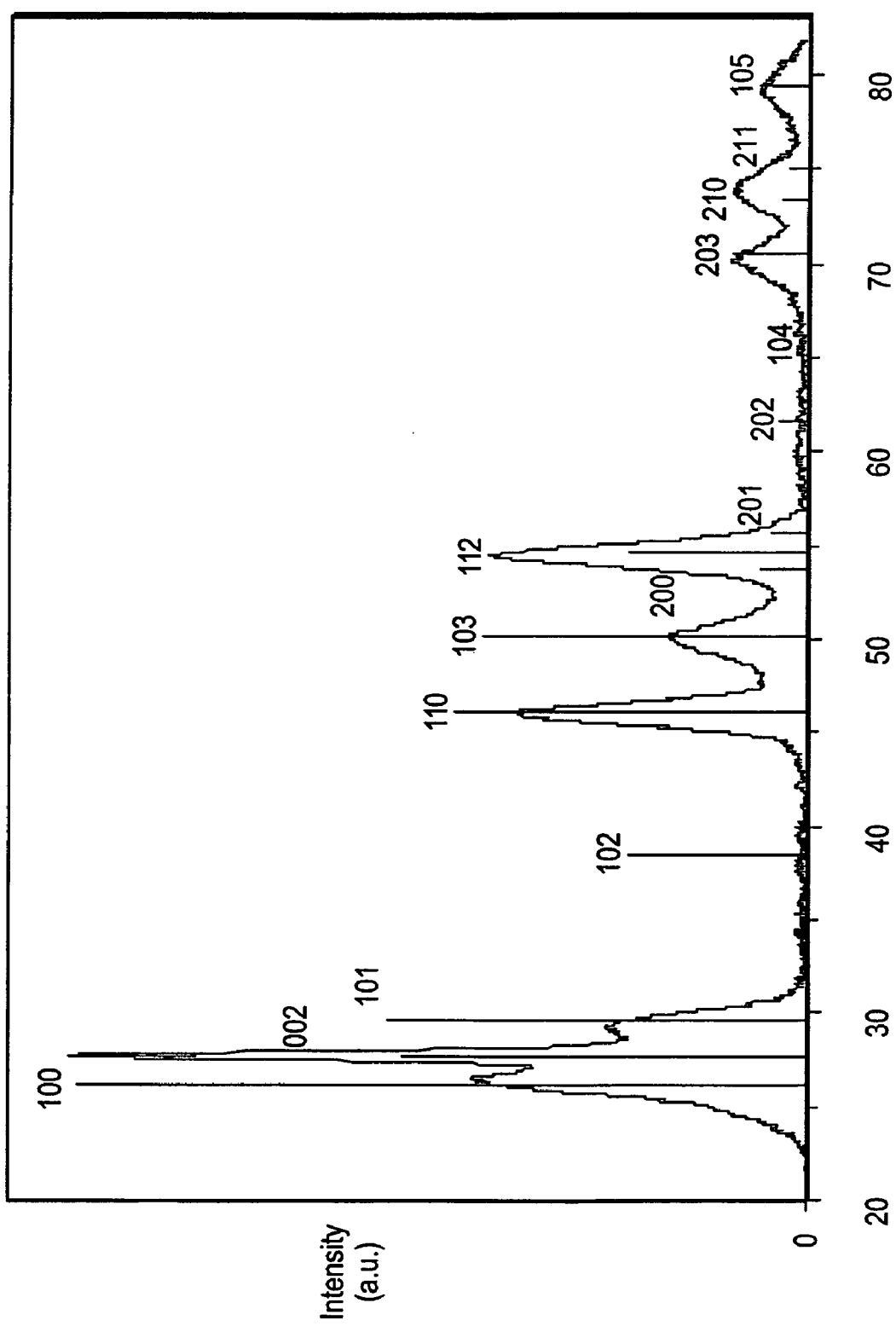

SHAPED NANOCRYSTAL PARTICLES AND METHODS FOR WORKING THE SAME

CROSS-REFERENCES TO RELATED APPLICATIONS

This application is a divisional of U.S. patent application Ser. No. 10/301,510, filed on Nov. 20, 2002 now U.S. Pat. No. 6,855,202, which is a non-provisional application based on U.S. Provisional Patent Application No. 60/335,435, filed on Nov. 30, 2001. These applications are herein incorporated by reference in their entirety for all purposes.

STATEMENT AS TO RIGHTS TO INVENTIONS MADE UNDER FEDERALLY SPONSORED RESEARCH OR DEVELOPMENT

The invention described and claimed herein was made in part utilizing funds supplied by the United States Department of Energy under contract NO. DE-AC03-76SF000-98 between the United States Department of Energy and The Regents of the University of California. The government has certain rights to the invention.

BACKGROUND OF THE INVENTION

The ability to systematically manipulate the shapes of inorganic nanocrystal particles remains a goal of modern materials chemistry. The shape and size of inorganic nanocrystal particles control their widely varying electrical and optical properties. One means of achieving shape control is through the use of a static template to enhance the growth rate of one crystallographic face over another. For example, two-dimensional films are obtained when there is favorable epitaxy on a substrate (Cho, J. Cryst., *Growth,* 202:1-7 (1999)). Pyramidal "dots" are obtained if there is strain between the growing crystallite and the epitaxial substrate, as in the growth of InAs on GaAs (Leon et al., *Science,* 267:1966-1968 (1995)) and Ge on Si (Liu et al., *Phys. Rev. Lett.,* 84:1958-1961 (2000)).

Anisotropic inorganic nanocrystal particles have also been grown in liquid media. The vapor-liquid-solid growth mechanism in which a solid rod grows out of a supersaturated droplet has been used to create one-dimensional materials (Hu et al., *Accounts of Chemical Research,* 32:435-445 (1999)), and has been applied to the growth of (insoluble) nanorods in a liquid medium (Trentler et al., *Science,* 270:1791-1794 (1995); Holmes et al., *Science,* 287:1471-1473 (2000)).

While anisotropic nanocrystal particles are useful, it would be desirable if nanocrystal particles with other shapes could be formed. As will be explained in further detail below, complex shaped nanocrystal particles such as tetrapods have a number of features that make them more desirable than nanocrystal rods or spheres for some applications. Other advantages of complex shaped nanocrystal particles are described below.

SUMMARY OF THE INVENTION

Embodiments of the invention are directed to shaped nanocrystal particles and processes for making shaped nanocrystal particles. The shaped nanocrystal particles can be branched (e.g., in the form of tetrapods), or can be in the form of teardrops or arrows.

One embodiment of the invention is directed to a process of forming a nanocrystal particle, the process comprising: (a) providing a core having a first crystal structure in a solution; and (b) forming an arm extending from the core having a second crystal structure in the solution.

Another embodiment of the invention is directed to a process for forming semiconductor nanocrystal particles comprising: introducing semiconductor nanocrystal particle precursors into a heated mixture of surfactants capable of promoting the growth of tetrapod shaped semiconductor nanocrystal particles; and forming tetrapod shaped semiconductor nanocrystal particles.

Another embodiment of the invention is directed to a nanocrystal particle comprising: a core having a first crystal structure; and at least an arm extending from the core, and having a second crystal structure.

Another embodiment of the invention is directed to a branched nanocrystal particle comprising: a core; at least a first arm extending from the core; and at least a second arm extending from the core, wherein the second arm forms a branch with respect to the first arm, and wherein the core, first arm, and the second arm comprise a Group II-VI or a Group III-V semiconductor.

Another embodiment of the invention is directed to a tetrapod shaped nanocrystal particle comprising: a core having a first crystal structure; a first arm extending from the core; a second arm extending from the core; a third arm extending from the core; and a fourth arm extending from the core, wherein the first, second, third, and fourth arms have a second crystal structure, wherein the first crystal structure is different than the second crystal structure.

Another embodiment of the invention is directed to a nanocrystal particle in the form a teardrop or an arrow.

Another embodiment of the invention is directed to a process for forming shaped nanocrystal particles comprising: (a) mixing semiconductor precursors and a mixture of surfactants to form a solution; and (b) forming nanocrystal particles in the solution, wherein the nanocrystal particles are in the form of teardrops or arrows.

These and other embodiments of the invention are described in further detail below.

BRIEF DESCRIPTION OF THE DRAWINGS

FIG. 2(*b*) shows ensemble optical absorption spectra for a series of tetrapods having comparable arm diameters, but different lengths.

FIG. 3(*b*) shows a schematic illustration of a branched tetrapod according to an embodiment of the invention.

FIG. 3(*c*) shows a schematic illustration of an inorganic dendrimer according to an embodiment of the invention.

In FIG. 6(*e*), a pine-tree shaped nanocrystal is also shown looking down the [001] direction (or long axis). HRTEM characterization shows that each shape of nanocrystal is predominately wurtzite, and that the angled facets of the arrows are the (101) faces.

FIG. 8(c) shows a HRTEM image of a nanocrystal, which after an additional injection shows growth on both the (001) and (00$\bar{1}$) faces. The center of this particle is zinc blende in structure.

FIG. 9(a) shows a typical tetrapod shaped CdSe nanocrystal particle, looking down the [001] direction of one arm. Lattice spacings confirm that all four arms are of the wurtzite structure. FIG. 9(b) shows a tetrapod that has branches growing out of each arm. There are zinc blende layers near the ends of the original arms and the branches are wurtzite with some stacking faults.

FIG. 14 shows a typical powder X-ray diffraction (XRD) of a CdTe tetrapod sample (non-vertical line with peaks). The bulk XRD pattern of CdTe wurtzite is also shown (vertical lines).

DETAILED DESCRIPTION

Figure 1:
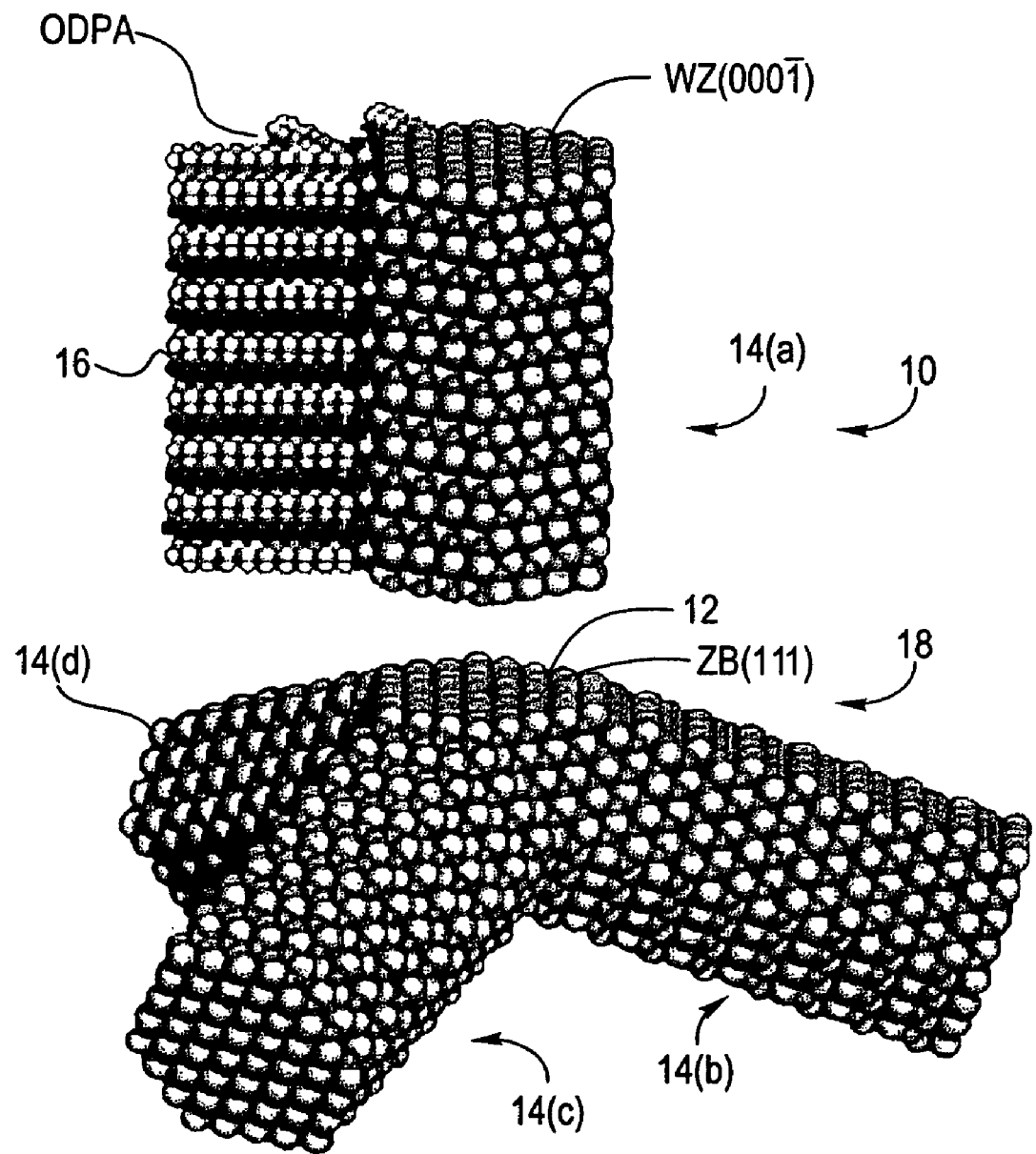
FIG. 1 shows a proposed model of a CdTe tetrapod.

In embodiments of the invention, the shapes of colloidal semiconductor nanocrystal particles can be systematically varied using the thermal decomposition of organometallic precursors in a hot mixture of surfactants. The hot mixture of surfactants may comprise, for example, trioctylphosphine oxide (TOPO) and an alkylphosphonic acid. As in the growth of spherical CdSe nanocrystal particles in hot trioctylphosphine oxide, the surfactants dynamically adsorb to the growing crystallites, allowing atoms to add and subtract for high crystallinity. This enables the growing crystallites to anneal, resulting in good crystallinity, while suppressing particle aggregation.

Controlled nanocrystal particle growth can depend on a number of factors. For example, the growth mode of the nanocrystal particles can be controlled by adjusting the monomer concentration. At low monomer concentration, Ostwald ripening occurs, and small nanocrystal particles can dissolve at the expense of larger ones. Such slow growth conditions favor the formation of a spherical particle shape (i.e., the nanocrystal particles want to form in a way that minimizes surface area). On the other hand, at high monomer concentration, relative differences between the growth rates of different faces can lead to anisotropic shapes. Using control mechanisms such as this, the present inventors herein demonstrate surprisingly the controlled formation of nanocrystal particles with tetrapod, teardrop, and arrow shapes.

As used herein, "nanocrystal particles" can refer to crystalline particles that have at least one dimension less than about 100 nanometers. In some embodiments of the invention, the nanocrystal particles may have two or more dimensions that are less than about 100 nanometers. For example, the branched nanocrystal particles according to some embodiments of the invention can have arms that have aspect ratios greater than about 1. In other embodiments, the arms can have aspect ratios greater than about 5, and in some cases, greater than about 10, etc. The widths of the arms may be less than about 200, 100, and even 50 nanometers in some embodiments. For instance, in an exemplary tetrapod with a core and four arms, the core can have a diameter from about 3 to about 4 nanometers, and each arm can have a length of from about 4 to about 50, 100, 200, 500, and even greater than about 1000 nanometers. Of course, the tetrapods and other nanocrystal particles described herein can have other suitable dimensions. In embodiments of the invention, the nanocrystal particles may be single crystalline or polycrystalline in nature.

The nanocrystal particles according to embodiments of the invention can have unique optical, electrical, magnetic, catalytic, and mechanical properties, and can be used in a number of suitable end applications. They can be used, for example, as fillers in composite materials, as catalysts, as functional elements in optical devices, as functional elements in photovoltaic devices (e.g., solar cells), as functional elements in electrical devices, etc.

I. Branched Nanocrystal Particles

Snowflakes are a familiar example in which a solid is formed with a high degree of branching. The branching of snow crystals is due to growth far from equilibrium, at high supersaturation levels of water. Higher levels of complexity arise when the growing snow crystals experience regions of different temperature and partial pressure of water as they fall, changing the relative growth rates of the different crystallographic facets.

Like snowflakes, embodiments of the invention can exhibit polytypism, or the existence of two or more crystal structures in different domains of the same crystal. Polytypism can be exploited to produce branched inorganic nanostructures in a controlled way. Frequently, polytypic structures share a common crystal facet, which is desirable for branching. In conventional macroscopic inorganic crystal growth, there are few examples of the controlled formation and growth of polytypic structures. There are also few examples of modulating growth rates of different crystal facets of a solid as a function of time. However, new methods for preparing inorganic nanocrystal particles with well-controlled sizes and shapes (e.g., spheres, rods, disks, and cubes) provide tools that can be adapted to form unique nanocrystal particles.

The tools can be used during the formation of nanocrystal particles to promote the stability of a certain phase over another and hence the formation of one crystal phase over another. This creates a new opportunity to generate artificial inorganic nanostructures with deliberately designed branches and interconnections.

Polytypism is generally prevalent in open, tetrahedrally bonded structures such as those occurring in the Group IV, III-V and II-VI semiconductors. In those semiconductors, there is only one type of chemical bond with local tetrahedral geometry. The tetrahedral building blocks are arranged in puckered rings, are comprised either of all chairs (cubic or zinc blende case) or are mixtures of chairs and boats (hexagonal or wurtzite case). The cubic and hexagonal structures differ only by their second nearest neighbor. The ±{111} facets of the cubic crystal of these materials are atomically identical to the ±(0001) facets of the hexagonal structure. These identical facets allow a nanocrystal particle to start growing with one type of crystal structure (e.g., a cubic crystal structure) and then transition to form a second type of crystal structure (e.g., a hexagonal crystal structure).

While the nanocrystal particles of embodiments of the invention can have any suitable material, CdTe is a particularly suitable candidate material for controlled branching. This is because this material has an appropriate energy difference between zinc blende and wurtzite structures. The energy difference between zinc blende and wurtzite in the bulk can be larger than 10 meV per atom for the most covalently or the most ionic structures (such as Si, GaAs, or ZnO), which rarely show polytypism. In contrast, moderately ionic structures, such as CdS and ZnS, occur almost indiscriminately in both phases due to an energy difference of only a few meV. In CdTe, this value is about 7 meV/atom, offering the possibility to control polytypism more easily. In CdTe, the cubic crystal structure is intrinsically more stable than the hexagonal crystal structure at the temperatures in which they can be grown in organic solution. Nucleation occurs in the cubic crystal phase, even though processing conditions may favor the growth of a hexagonal crystal structure. In embodiments of the invention, the energy difference between different crystal structures in a particular material is preferably less than 20 meV/atom, less than 15 meV/atom, or less than 10 meV/atom so that polytypic structures can be created.

For CdTe and other materials, if the growth of the nanocrystal particle takes place at high temperatures (e.g., greater than about 290° C. for CdTe) and/or at a suitably high monomer concentration and/or in the presence of a surfactant that promotes it, then the growth of a hexagonal wurtzite structure can be favored over a cubic zinc blende structure. (It is understood that the processing temperatures may vary depending upon the particular material produced.) These surfactant molecules are known to selectively stabilize the facets perpendicular to the c-axis of hexagonal nanocrystal particles. This stabilization considerably reduces the growth rate of these facets, which have no equivalent in the cubic structure. Thus, in the presence of phosphonic acid, nanocrystal particles such as CdTe nanocrystal particles nucleate zinc blende and grow in the wurtzite phase. Here, the present inventors demonstrate the reproducible synthesis, in high yield, of tetrapod shaped nanocrystal particles based upon this scheme.

In some embodiments, processing conditions can be adjusted or selected to allow for the formation of nanocrystal particles such as tetrapods, bipods, tripods, branched tetrapods, and inorganic dendrimers. Processing conditions can be adjusted or selected to favor the growth of one crystal structure over another to grow cores or arms as desired. For example, for compound semiconductors such as CdSe and CdTe, low reaction temperatures favor the formation of a cubic crystal structure, while higher reaction temperatures favor the formation of a hexagonal crystal structure. Low monomer concentrations favor the formation of a cubic crystal structure, while high monomer concentrations favor the formation of a hexagonal crystal structure. Parameters such as these can be manipulated to favor the growth of one crystal structure over another. For example, processing conditions can be selected so that they are favorable to the formation of a cubic crystal core structure. Then, they can be adjusted so that they are favorable to the formation of hexagonal crystal arm structures. As will be explained in detail below, using such methods, polytypic nanocrystal particles can be formed.

A tetrapod shaped nanocrystal particle 10 according to an embodiment of the invention is shown in FIG. 1 and has a zinc blende core 12 with four ±{111} facets 18, each projecting a wurtzite arm 14(a), 14(b), 14(c), 14(d) that is terminated with the ±(000$\bar{1}$) facet 16. In FIG. 1, the exploded view of one arm 14(a) illustrates the identical nature of the ±(111) zinc blende (ZB) and ±(000$\bar{1}$) wurtzite (WZ) facets of the core and the arms, respectively. Phosphonic acid molecules 16 selectively bind to the lateral facets of the arms 14(a)-14(d), as suggested in the figure (for clarity, only two facets are shown covered) to inhibit growth on these facets. High-resolution TEM analysis would further clarify the shape of the cubic nucleus and the relative orientations between the various arms of the tetrapod.

Although CdSe and CdTe branched nanocrystal particles are described in detail herein, the branched nanocrystal particles may comprise any material. For example, the particles may comprise semiconductors such as compound semiconductors. Suitable compound semiconductors include Group II-VI semiconducting compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. Other suitable compound semiconductors include Group III-V semiconductors such as GaAs, GaP, GaAs-P, GaSb, InAs, InP, InSb, AlAs, AlP, and AlSb. The use of Group IV semiconductors such as germanium or silicon may also be feasible under certain conditions. In other embodiments, the particles may comprise a dielectric material such as SiC, SiN or any other material that can exhibit polytypism. Some metals such as Fe, Ni, Cu, Ag, Au, Pd, Pt, Co and others may also exhibit polytypism and can be used in embodiments of the invention.

A. Methods For Forming Branched Nanocrystal Particles

Embodiments of the invention include methods of forming branched, nanocrystal particles. In one embodiment, the method comprises forming a core having a first crystal structure in a solution. The core may have a cubic crystal structure (e.g., a zinc blende structure) or any other suitable crystal structure. Then, one or more arms can form from the core, simultaneously or sequentially. The arms may have different crystal structures than the core. If a tetrapod is formed, the tetrapod may have first, second, third, and fourth arms, each with a hexagonal crystal structure extending from the core.

The types of precursors used to form the branched, nanocrystal particles depend on the particular nanocrystal particles to be formed. In some embodiments, the precursors used to synthesize the nanocrystal particles include Group II, III, IV, V, and/or VI semiconductor precursors. For example, in embodiments of the invention, semiconductor nanocrystal particles including a Group II-VI compound semiconductor can be the reaction product of at least one precursor containing a Group II metal containing precursor and at least one precursor containing a Group VI element, or a precursor containing both a Group II and a Group VI element. In other embodiments of the invention, semiconductor nanocrystal particles including a Group III-V compound semiconductor can be the reaction product of at least one precursor containing a Group III element and at least one precursor containing a Group V element, or a precursor containing both a Group III and a Group V element. Other exemplary precursors, surfactants, and solvents can be found in U.S. Pat. Nos. 6,225,198 and 6,306,736. These U.S. Patents are herein incorporated by reference in their entirety for all purposes.

If Group III-V semiconductor nanocrystal particles are to be synthesized, a Group III precursor, such as elemental Ga, In, Al, or any compound containing a Group III precursor, such as a GaIII salt, InIII salt, or AlIII salt (e.g., of a halide, or corresponding metal-carbon trialkyls) can be reacted directly with an arsenic, phosphorus, or antimony source such as arsine, phosphine, or stibine; an alkyl arsine, phosphine or stibine; or an alkyl silyl arsine, phosphine or stibine in liquid phase at an elevated temperature. Representative metal sources include $GaCl_3$, $GaBr_3$, $GaI_3$, $InCl_3$, $InBr_3$, $AlC_3$, $Ga(Me)_3$, $Ga(Et)_3$, $Ga(Bu)_3$, or the like. Representative arsenic, phosphorus and selenium sources include $AsH_3$, $PH_3$, $SeH_3$, $AsH_2$ (carbon alkyl), As(carbon alkyl)$_3$, P(carbon alkyl)$_3$, As(Si(carbon alkyl)$_3$)$_3$, P(Si(carbon alkyl)$_3$)$_3$, Se(Si(carbon alkyl)$_3$)$_3$ and the like. Although specific examples of precursors are provided, any Group III or V element and any compound containing such an element can be used in embodiments of the invention.

If Group II-VI semiconductor nanocrystal particles are to be synthesized, they may be the product of a reaction containing at least one precursor comprising a Group II element such as Zn, Cd, or Hg, or any Group II containing molecule such as a metal, salt, oxide, organometallic compound, and at least one precursor comprising a Group VI element such as O, S, Se, or Te, or any Group VI containing molecule such as a metal, salt, oxide, organometallic compound, or a precursor containing both a Group II element (Zn, Cd, or Hg) and a Group VI element (S, Se, or Te). Those of skill in the art can select the appropriate precursors to form the appropriate compound semiconductor. For example, $Cd(CH_3)$ and Se:TOP are examples of precursors respectively containing Group II and Group VI elements that can be used to form CdSe nanocrystal particles.

The precursors may be dissolved in any liquid compatible with the surfactant mixture. Examples of organic liquids include polar organic solvents including trialkyl phosphine, e.g., tributyl phosphine. In some embodiments, the precursors may be dissolved in the same solvent or may be dissolved separately to form two or more precursor solutions.

Embodiments of the invention can use a surfactant mixture to make the semiconductor nanocrystal particles. The surfactant mixture can be a high boiling point liquid mixture of two or more reactive or non-reactive organic surfactants. The mixture of these organic surfactants is capable of promoting the growth of branched semiconductor nanocrystal particles.

The surfactant mixture can have a boiling point that is high enough so that a reaction between, for example, the Group II and Group VI precursors, or the Group III and Group V precursors, can take place to form the desired semiconductor nanocrystal particles. For example, in some embodiments, the surfactant mixture can have a boiling point between about 200° C. to about 400° C.

The surfactant mixture may include any suitable number of different surfactants. For example, the surfactant mixture may include a first organic surfactant and a second organic surfactant. Third, fourth, fifth, etc. surfactants could also be used. For example, in some embodiments of the invention, at least one or two of the surfactants can be selected from the group consisting of a phosphonic acid, trioctylphosphine oxide, an amine, oleaic acid, and stearic acid. As noted above, the surfactant mixture can be capable of being heated to a crystal-growing temperature, and can promote the growth of branched semiconductor nanocrystal particles such as tetrapods.

The first surfactant in the surfactant mixture may comprise a phosphorus-containing surfactant capable of withstanding such crystal-growing temperatures. Examples of such first phosphorus-containing liquid surfactants include liquid surfactants such as 3-30 (or larger) carbon trialkyl phosphines (e.g., tributyl phosphine), or 3-30 or larger carbon trialkyl phosphine oxides (e.g., trioctyl phosphine oxide or "TOPO"). The first surfactant may also include other surfactants including molecules including functional groups such as amines, carboxylic acids, and any other groups as long as they are stable.

The surfactant mixture can include a second organic surfactant. The second organic surfactant may be capable of being heated to crystal-growing temperatures and may be capable of promoting the growth of branched semiconductor nanocrystal particles. Preferably, the second liquid surfactant capable of promoting the growth of branched semiconductor nanocrystal particles can comprise a phosphorus-containing surfactant capable of withstanding such crystal-growing temperatures.

The second organic surfactant may comprise an organic-substituted acid, or acid salt surfactant containing phosphorus such as, for example, phosphonic and phosphinic acids. Suitable phosphinic acids may include mono and diphosphinic acids having the general formula $R'R_xH_{(1-x)}POOH$, where R and R' are the same or different 3-30 carbon (but preferably 3-30 carbon) organic groups such as alkyl or aryl groups, and x is 0-1. In some embodiments, the second organic surfactant comprises a 3-30 carbon alkyl phosphonic acid, e.g., octadecyl phosphonic acid.

The second organic surfactant is preferably a long chain length phosphonic acid. Short chain length phosphonic acids are defined as those having an alkyl chain length of less than or equal to about 10 carbon atoms. Long chain length phosphonic acids are defined as those having an alkyl chain length of greater than or equal to about 10 carbon atoms. In preferred embodiments, the phosphonic acid is at least 14 carbon atoms long. An example is octyldecylphosphonic acid (ODPA). For materials such as CdTe, these long chain length phosphonic acids help to promote the growth of hexagonal crystals.

In embodiments of the invention, a solution of one or more precursors can be slowly and/or quickly injected into a heated surfactant mixture. Injecting precursors slowly is a relative term that is readily determinable by one having ordinary skill in the art. It can include adding precursors drop by drop or no faster than 10 drops/sec, 5 drops/sec, 2 drops/sec, or 1 drop/sec. Injecting precursors quickly is also a relative term readily determinable by one having ordinary skill in the art. It can include adding precursors at a speed greater than 100 drops/sec, 20 drops/sec, or 10 drops/sec. For example, injecting precursors quickly can include emptying a 5 mL syringe holding the precursor as quickly as possible.

A solution of precursors can be injected into the surfactant mixture at a cold or low temperature solution so that immediately after the injection, the temperature of the hot mixture of surfactants drops to a second, lower temperature.

Initially, the heated surfactant mixture may or may not contain other precursors. A pipette or a pressure nozzle may be used as an injection apparatus. The temperature can be kept constant during the nanocrystal growth. The resulting mixture is maintained at a first temperature, which results in the nucleation of seed crystals.

It is understood that the different precursors could be in their own separate solutions and these different solutions could be separately injected into the heated surfactant mixture in embodiments of the invention. For example, if CdSe nanocrystal particles are to be formed, a Cd precursor solution and a Se precursor solution can be separately and sequentially injected into a hot surfactant mixture to produce branched CdSe nanocrystal particles. The separate injection of precursors into a hot surfactant mixture is preferred as it results in better control of the reaction, which can allow a higher percentage of branched nanocrystal particles if desired (e.g., a higher percentage of tetrapods).

The precise reaction time may vary depending on the particular material used and the particular type of nanocrystal particles formed. In some embodiments, a 5 minute reaction time may be sufficient, while less than or more than 5 minutes may be desirable in other embodiments.

Subsequent nanocrystal growth can then be stopped by a further reduction of the temperature to below the temperature at which nanocrystal growth occurs. Cessation of the crystal growth may be accomplished by rapidly reducing the temperature to ambient temperature or even lower, e.g., to less than 150, 100, 75, 50, or 25° C. or lower, e.g., by removing the heating mantle that was used as a heat source. The temperature can be reduced more rapidly if the solution is cooled with a stream of air, cold water, liquid nitrogen, dry ice or other cooling agent.

After they are formed, the semiconductor nanocrystal particles can be separated from the liquid medium that is used to form them. In some embodiments, a solvent such as methanol or acetone is added to the liquid medium containing the semiconductor nanocrystal particles to precipitate them. For example, CdSe particles are generally not soluble in polar solvents such as methanol or acetone. Any appropriate solvent can be added to precipitate the nanocrystal particles from the solution.

After the nanocrystal particles have precipitated, the precipitated nanocrystal particles are separated from the rest of the solution. In some embodiments, centrifuging can be used to separate the nanocrystal particles from other solution components. After centrifuging, the supernatant can be separated from the nanocrystal particles. The nanocrystal particles can then be stored as precipitate or can be dried in a vacuum.

In a typical synthesis of CdTe tetrapods, a mixture of octadecylphosphonic acid (ODPA), trioctylphosphine oxide (TOPO) and cadmium oxide (CdO) is degassed at 120° C. for 20 minutes and is slowly heated under Ar until the CdO decomposes and the solution turns clear and colorless. Next, 1.5 g of trioctyl phosphine (TOP) is added, and the temperature is further raised to 320° C. After that, Te:TOP (concentration of Te 10% by weight) is quickly injected into the solution. The temperature drops to 315° C. and is maintained at this value throughout the 5 minute synthesis. The resulting tetrapods are obtained in high yield, and they are soluble in common organic solvents, such as toluene and chloroform.

In some embodiments, branched nanocrystal particles such as tetrapods may be co-formed with other types of nanocrystal particles such as rods or spheres. If this occurs, it is possible to separate the tetrapods from the rods to increase the percentage of tetrapods in a given sample. For example, a solution may contain nanocrystal rods and tetrapods. The tetrapods can constitute more than about 1%, 5%, 10%, 20%, 40%, 60%, 80%, 90%, 95%, or 99% of all particles in the initial sample depending on the growth conditions. Processes for separating tetrapods from other nanocrystals are described in the Examples below.

Because the branched nanocrystal particles according to embodiments of the invention can be formed in a surfactant mixture, the nanocrystal particles that result may be functionalized with surfactant molecules. For example, the core, and/or arms of a nanocrystal particle according to embodiments of the invention may be functionalized with any of the above-mentioned surfactant molecules (e.g., amphiphilic molecules). It is noted that the arrow and teardrop shaped nanocrystal particles described below could also be functionalized with surfactant molecules.

The branched nanocrystal particles according to embodiments of the invention can be formed with arms of any suitable length or diameter. It is possible to control the phase during nucleation and growth, and to manipulate the growth kinetics of the nanocrystal particles to enable independent tuning of the arm lengths and diameters. The present inventors have found that once the basic tetrapod shape is formed, growth of the arms occurs according to the controllable kinetic mechanisms previously observed for nanorods. See, for example, Manna et al., *J. Am. Chem. Soc.* 2000, 122, 12700-12706.

For example, with respect to CdTe tetrapods, higher Cd/Te ratios result in longer arms, while more phosphonic acid per Cd yields larger arm diameters. Anisotropy results from fast growth, and the growth rate is limited by the concentration of the Cd precursor, which is a strong complex between $Cd^{2+}$ and phosphonic acid. Hence, higher Cd/Te ratios keep the reaction in the anisotropic growth regime longer, leading to longer arms. On the other hand, the presence of more phosphonic acid per Cd (lower Cd/ODPA ratio) likely decreases the diffusion constant of the Cd precursor and the driving force for its addition to the crystal, thereby slowing the growth rate for a given Cd concentration. However, the growth of the arms continues as long as Cd concentration is sufficiently high. This results in less anisotropic rods, with a larger diameter for a given length.

Tetrapods with arms of identical length can also be formed. This generally involves the simultaneous development of the four wurtzite arms and a highly homogeneous environment around the growing tetrapod structure. This implies, for instance, a fast and isotropic supply of monomer species from the bulk. When these homogenous conditions are not present, some arms can grow substantially slower than others, or even not at all, resulting in so-called "tripods", "bipods" and "monopods". Tripods and bipods are examples of branched nanocrystal particles. Additionally, missing arms can be due to differences in the shrinkage rate of the various arms in the same tetrapod.

The nanocrystal particles according to embodiments of the invention can have a variety of interesting mechanical, electrical, and optical properties. For example, due to their three dimensional character, tetrapods may be important alternatives to nanocrystal fibers and rods as additives for mechanical reinforcement of polymers (e.g., polymeric binders including polyethylene, polypropylene, epoxy functional resins, etc.). Tetrapod shaped nanocrystal particles, for example, can interlock with each other and can serve as a better reinforcing filler in a composite material (e.g., with a binder), than for example, nanospheres. The nanocrystal particles can be mixed with the binder using any suitable mixing apparatus. After the composite material is formed, the composite material can be coated on a substrate, shaped, or further processed in any suitable manner.

Figures 2A, 2B:
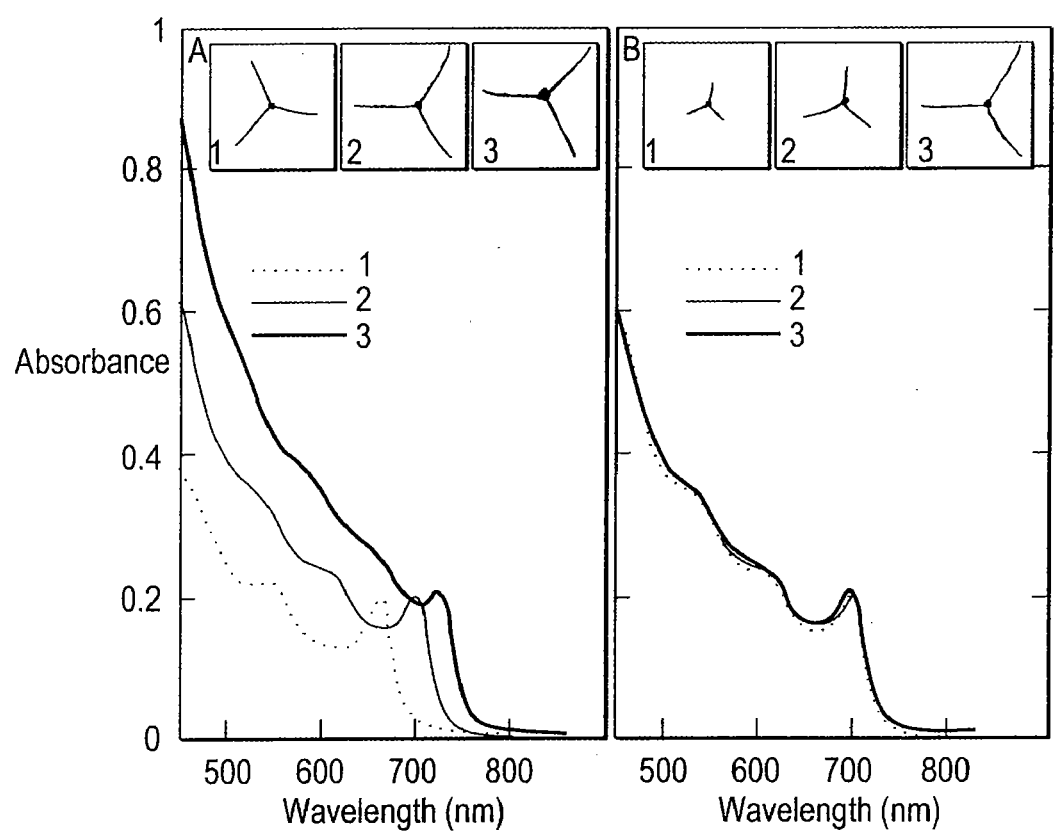
FIG. 2(*a*) shows ensemble optical absorption spectra for a series of tetrapods having comparable arm lengths, but different diameters.

The nanocrystal particles according to embodiments of the invention can also have unique optical properties. For example, FIGS. 2(a) and 2(b) compare the electronic absorption spectra for two series of tetrapod samples having different arm lengths and diameters. In a tetrapod shaped nanocrystal, most of the confinement energy is along the diameter of the hexagonal arms. Tetrapods having comparable arm lengths but different diameters, show remarkable differences in their band gap energy (FIG. 2(a)). While spectra of tetrapods with comparable diameters but different arm lengths, are almost identical (FIG. 2(b)). This independent tunability of the arm length and the band gap is very attractive for nanocrystal based solar cells or other types of photovoltaic devices. Exemplary photovoltaic devices are described in, for example, *Science*, Vol. 295, pp. 2425-2427, Mar. 29, 2002. An exemplary photovoltaic device may have nanocrystal particles in a binder. This combination can then be sandwiched between two electrodes (e.g., an aluminum electrode and an indium tin oxide electrode) on a substrate to form a photovoltaic device.

The inherent property of a tetrapod to self-align on a substrate with one arm always pointing towards one electrode, combined with the low band gap material such as CdTe, should substantially enhance the device efficiencies of recently reported hybrid nanorod-polymer solar cells. In comparison to nanocrystal particles that are randomly oriented, the tetrapods according to embodiments of the invention are aligned and can provide for a more unidirectional current path than randomly oriented nanocrystal particles.

Although tetrapods have just been described in detail, it is understood that embodiments of the invention include even more complex shaped nanocrystal particles. In embodiments of the invention, the initial nucleation event yields a core with a cubic crystal structure (e.g., a zinc blende crystal structure). Later, arms with a hexagonal crystal structure (e.g., wurtzite) can grow out from the core. However, different growth conditions can be provided to statistically alternate the formation of cubic and hexagonal crystal structures, thus leading to irregular branching. Precise control of temperatures throughout the reaction may yield sequentially branched "inorganic dendrimers". This can be illustrated with reference to FIGS. 3(a)-3(c).

Figure 3C:
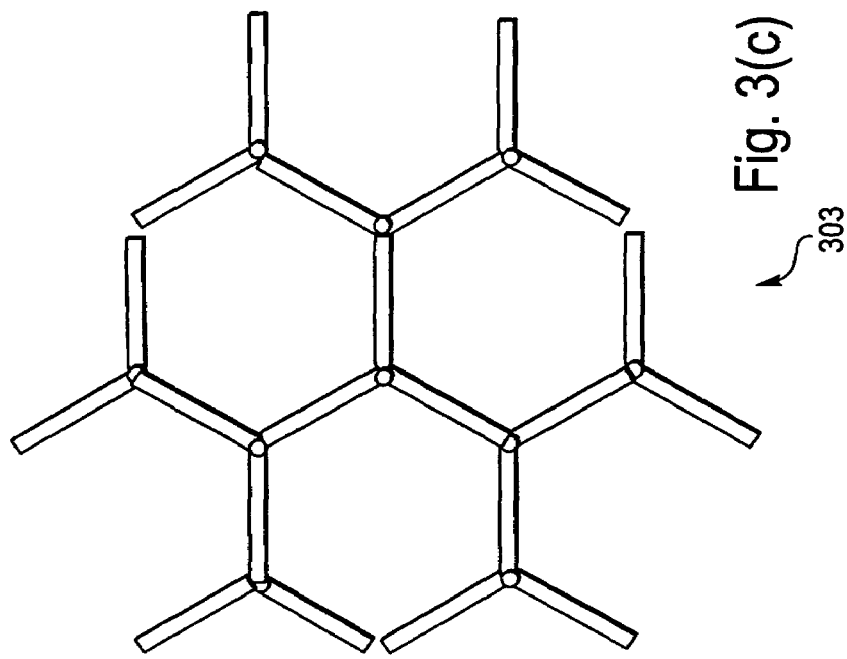
FIG. 3(*a*) shows a schematic illustration of a tetrapod according to an embodiment of the invention.
Figure 3A:
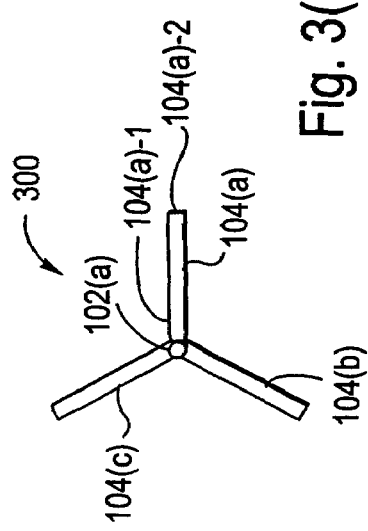

FIG. 3(a) shows a tetrapod 300 according to an embodiment of the invention looking down one arm of the tetrapod 300. The tetrapod 300 includes a cubic core 102(a) and four arms with hexagonal crystal structures extending from the cubic core 102(a). Adjacent arms can form angles of about 109.5 degrees (it has tetrahedral symmetry) in some embodiments. In FIG. 3(a), three arms 104(a)-104(c) are shown, with the fourth arm of the tetrapod extending toward the reader. As shown, each arm can include a proximate end and a distal end. For example, the arm 104(a) has an end 104(a)-1 that is proximate to the core 102(a) and an end 104(a)-2 that is distal to the core 102(a).

In the formation of the tetrapod, the cubic core 102(a) forms and then the four arms having a hexagonal crystal structure grow from that core 102(a). Processing conditions can be adjusted to cause the arms to grow from the core 102(a) or the arms may inherently form from a given set of conditions. For example, for CdTe nanocrystal particles, providing hexagonal crystal growing conditions can result in tetrapods without the need to adjust processing conditions. As the present inventors have demonstrated, simply providing conditions favorable hexagonal crystal growth can result in CdTe tetrapods. Alternatively, as shown in the CdSe tetrapod examples below, processing conditions can be adjusted to form branches. Higher monomer concentrations (e.g., adding more precursor to a surfactant mixture) and higher temperatures can be used to induce the formation of arms with hexagonal crystal structures, while lower monomer concentrations and lower temperatures can be used to induce the formation of cubic crystal structures.

Figure 3B:
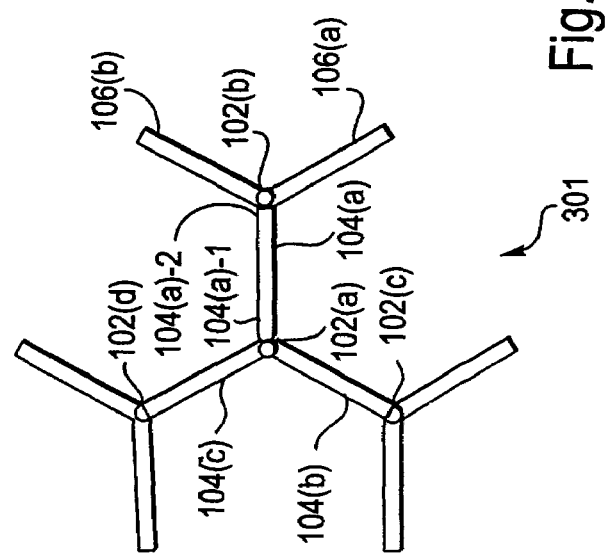

With this in mind and referring to FIG. 3(b), once the basic tetrapod is formed, additional branches on the tetrapod can be formed. For example, as shown in FIG. 3(b), additional arms 106(a), 106(b) can form from a second core 102(b) at the distal end 104(a)-2 of the arm 104(a). The arms 106(a), 106(b) may appear as branches. As a result, another tetrapod can form at the distal end 104(a)-2 of the arm 104(a). The resulting nanocrystal particle may be a branched tetrapod 301.

To form the branched tetrapod 301 in FIG. 3(b), an initial tetrapod 300 can first be formed as shown in FIG. 3(a). Growth conditions will favor the formation of the hexagonal arms 104(a)-104(c). Then, the processing conditions can be adjusted to form cores at the ends of the arms 104(a)-104(c). For example, the processing temperature can be lowered and/or the monomer concentration can be lowered. These conditions, in general, result in the formation of additional (or second) cubic crystal structure cores 102(b)-102(d) at the ends of the arms 104(a)-104(c). Once the additional cubic crystal structure cores are formed, processing conditions can again be adjusted to favor the growth of hexagonal structure arms. For example, the processing temperature can be raised and/or the monomer concentration in the solution can be increased to cause arms with hexagonal crystal structures to form. This process can be repeated as often as desired to form, for example, an inorganic dendrimer 303. An example of an inorganic dendrimer 303 is shown in FIG. 3(c). Compared to the tetrapod 300 and the branched tetrapod 301, the inorganic dendrimer 303 is more complex in shape.

Figure 4A:
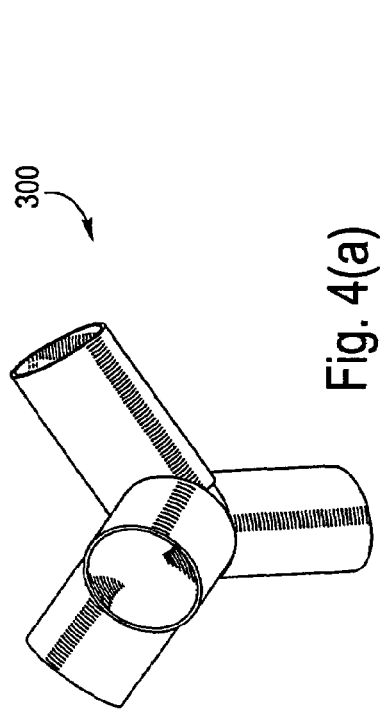
FIGS. 4(*a*)-4(*c*) show schematic 3-dimensional illustrations of how a branched tetrapod is formed.
Figure 4B:
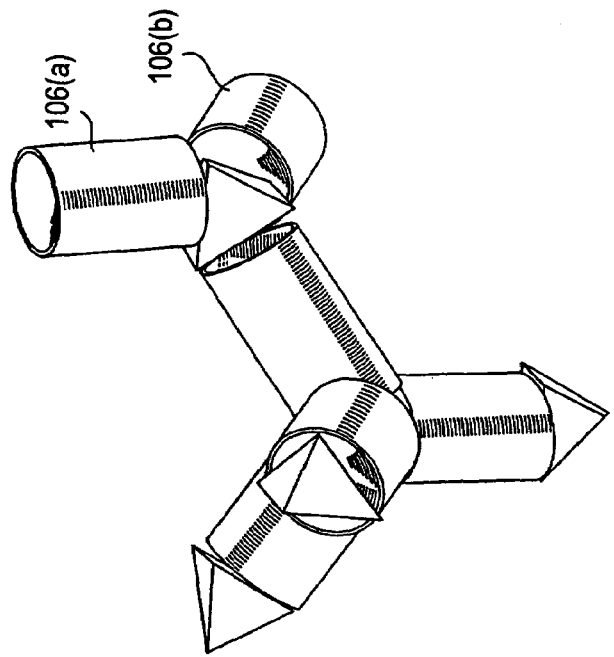
Figure 4C:
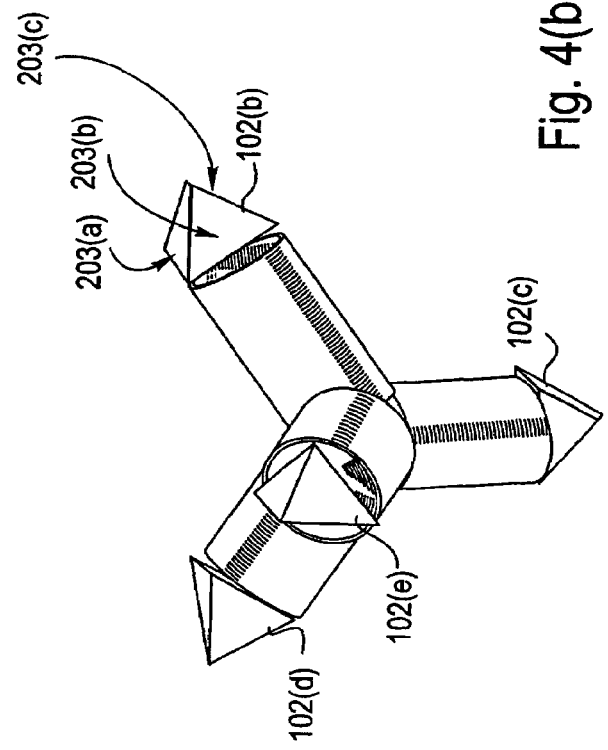
Figure 6A:
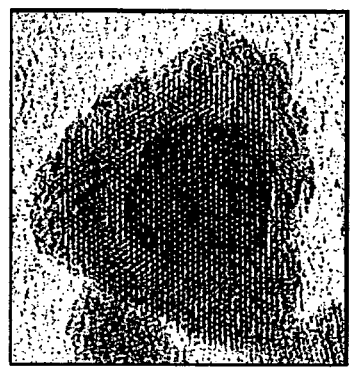
FIGS. 6(*a*)-6(*e*) show transmission electron micrographs (TEMs) of nanocrystal particles produced using 60 mole % HPA (FIG. 6(*a*)). High resolution TEM (HRTEM) images show the stages of growth from (FIG. 6(*b*)) pencil to (FIG. 6(*c*)) narrow arrow to (FIG. 6(*d*)) pine-tree shaped nanocrystal particles.
Figure 6E:
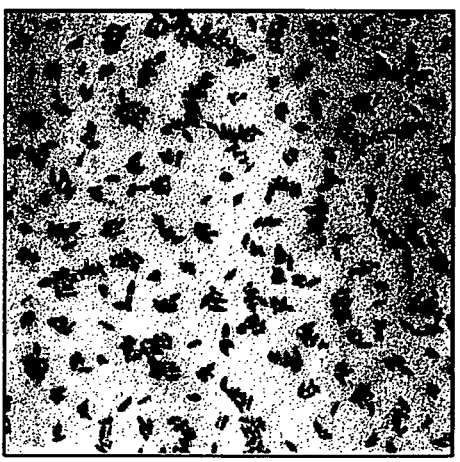
Figure 6D:

Other schematic, three-dimensional illustrations of how branched tetrapods can form are in FIGS. 4(a)-4(c). In FIGS. 3(a)-3(c) and 4(a)-4(c), like numerals designate like elements and the description of common elements need not be repeated.

FIG. 4(a) shows a tetrapod 300. As noted above, as shown in FIG. 4(b), processing conditions can be selected so that four cores 102(b)-102(e) form at the distal ends of four arms of a basic tetrapod. In FIG. 4(b), the faces 203(a), 203(b), 203(c) of the core 102(b) are more clearly shown. As shown in FIG. 4(c), arms 106(a)-106(b) form on the faces 203(a)-(c). For clarity, only two arms 106(a)-106(b) are shown in FIG. 4(c).

II. Arrows

In other embodiments of the invention, arrow-shaped nanocrystal particles can be formed. In an exemplary embodiment, precursors are introduced into a mixture of surfactants to form a solution. As noted above, the mixture of surfactants can be hot and the precursors can be introduced using an injection process. Once the precursors and the surfactants are mixed together, arrow-shaped nanocrystal particles can form in the solution. It is understood that "arrow-shaped" nanocrystal particles can include tree-shaped nanocrystal particles such as pine-tree shaped nanocrystal particles.

Examples of precursors, solvents, surfactants, and processing conditions (e.g., injection rates, processing temperatures, etc.) are described above, and need not be repeated herein. Any of these may be suitable for use with the formation of arrow-shaped nanocrystal particles. However, to form arrow-shaped nanocrystal particles, the amount of the second surfactant is preferably greater than about 30 mole %, 60 mole %, and even 70 mole % based on the total moles of the surfactants in the surfactant mixture (e.g., based on the total moles of the first and second surfactants). Surprisingly and unexpectedly, higher concentrations of the above described second surfactant can result in arrow-shaped nanocrystal particles.

In an exemplary embodiment, to form CdSe arrow-shaped nanocrystal particles, cadmium and selenium precursors are co-dissolved in tri-n-butyl phosphine. This precursor solution is manually injected into 4 grams of a hot (360° C.) binary surfactant mixture of TOPO and HPA. The amount of HPA is 60 mole % based on the total moles of TOPO and HPA. Nanocrystal particles form and some of these nanocrystal particles are in the form of arrows. The arrows are precipitated and separated from other particles as described in the Examples section below.

Higher HPA ratios naturally lead to the formation of arrow shaped nanocrystal particles. Without being bound by theory, this can be understood as arising from further enhancement of the growth rate of the $(00\bar{1})$ face relative to the other faces. In crystal growth, the fastest growing face is eventually replaced by slower growing faces, and this is how the basic arrow shapes (see, e.g., the arrows in FIGS. 6(b)-6(e)) form. The {101} faces of the arrow grow more slowly than the $(00\bar{1})$ face, and in the high HPA limit where $(00\bar{1})$ is growing extremely quickly, it is eventually replaced by the (101) equivalent faces. Within the kinetic regime, these variations of shape will arise just from differential growth rates of the various faces, regardless of absolute rate of growth (whether the growth of the unique face is enhanced or the growth rates of all the other faces are retarded by the HPA).

Using TEM images of samples taken at different times after injection, it is possible to follow the shape evolution as the reaction proceeds. The percentage of narrow arrow and tree shaped nanocrystal particles (which can also can be considered arrows) increases with time while the amount of rods and pencils decreases. Despite the fact that the nanocrystal particles presumably grow from rods to pencils to arrows (and to a more specific form of arrow, a pine tree), the rate of growth of the $(00\bar{1})$ face is nearly constant. The average lengths of different particle shapes at a certain time can be within about 2% of each other, indicating that the rate of growth along the c-axis is not affected by the additional growth on the sides of the nanocrystal particle.

Figure 10:
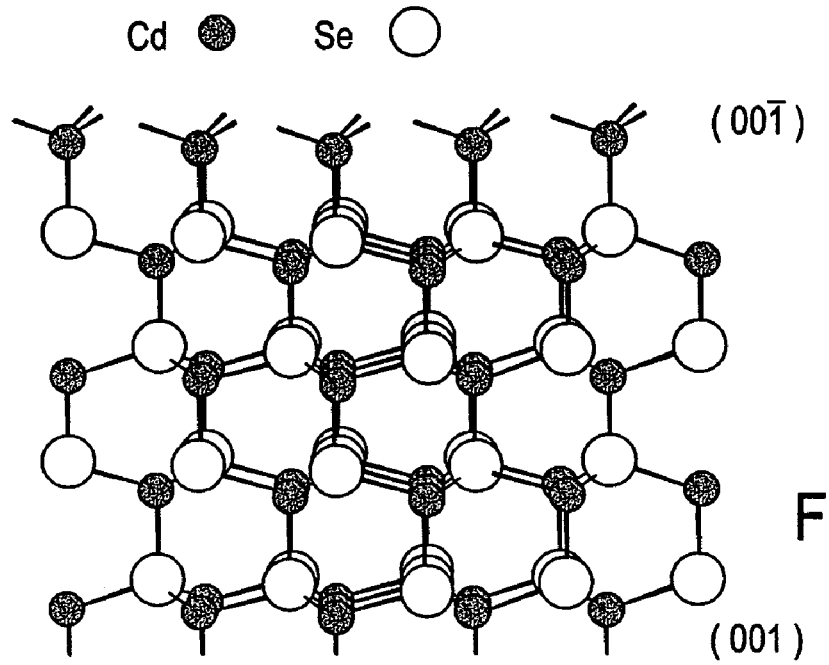
FIG. 10 shows an atomic model of CdSe in the wurtzite structure demonstrating the differences between the (001) and (00$\bar{1}$) faces. On the (00$\bar{1}$) face, Cd atoms have only one dangling bond, while on the (001) face, Cd atoms have three dangling bonds that need to be passivated.

The formation of arrows suggests unidirectional growth. The hexagonal CdSe nanocrystal particles do not have inversion symmetry, meaning the top and bottom faces of the crystals are intrinsically different. As can been seen in FIG. 10, for example, Cd atoms on the (001) face have one dangling bond, while Cd atoms on the $(00\bar{1})$ face have three dangling bonds. It appears that in the presence of HPA, the relative growth rate of the $(00\bar{1})$ face is much greater than that of the others.

III. Teardrops

Other embodiments of the invention are directed to teardrop-shaped nanocrystal particles. Teardrop shaped nanocrystal particles can be formed by mixing semiconductor precursors and a mixture of surfactants to form a solution. Examples of precursors, solvents, surfactants, and processing conditions (e.g., injection rates, processing temperatures, etc.) are described above, and need not be repeated herein. Any of these may be suitable for use with the formation of teardrop-shaped nanocrystal particles.

To form teardrop shaped nanocrystal particles, however, a first amount of one or more semiconductor precursors are injected into a hot surfactant mixture to form a precursor/surfactant solution. A slow injection rate (1.0 ml/s) results in a drop of the monomer concentration below the Ostwald ripening limit for some time (e.g., into about 4 grams of surfactant mixture). After this first amount is introduced, the reaction proceeds and there is a waiting period where no precursor is introduced to the solution. This waiting time may vary depending on the exact teardrop morphology desired. For example, the waiting time between sequential introductions of precursors into a hot surfactant mixture can be as little as 30 seconds in some embodiments, and can be greater than about 1 minute in other embodiments. (As an alternative to waiting and not introducing precursors into the hot surfactant mixture between successive precursor injections, the rate of introduction of the precursors can be reduced relative to prior rates of precursor introduction.) At this point the nanocrystal particles will form low aspect ratio rods, or if left under these conditions for a considerable amount of time, nearly spherical or oblong dots. After a predetermined amount of time, a second amount of the precursors is introduced into the solution (or the rate of precursor introduction into the surfactant mixture can be increased relative to a prior precursor introduction rate). The monomer concentration is once again increased with an additional slow injection to reinitiate rod growth. The increase in the monomer concentration causes the somewhat spherical or oblong nanocrystal particles to form elongated portions. The resulting nanocrystal particles are teardrop shaped.

In an exemplary embodiment, to form teardrop particles, a 1.0 ml of stock solution including Cd and Se precursors can be injected into 20% HPA in TOPO at 360° C. at a rate of about 10 ml/s. The temperature can be maintained at 328° C. The high temperature and low monomer concentration promotes Ostwald ripening of the nanocrystal particles. An additional slow injection of 2.0 ml of the same stock is made after one minute. This injection can take about 4 minutes. After about 20 minutes, after the second injection, the synthesis is stopped. Teardrop shaped nanocrystal particles are formed after the second injection.

Teardrop growth illustrates how time varying concentrations can be used to create nanocrystal particles with complex shapes. The unidirectional growth noted in arrow formation is also a factor in the formation of the teardrops. Here, however, it is possible to take advantage of a third major effect, namely, that slow growth favors equilibrium, and round shapes. Teardrop shapes arise when rod like crystals are subsequently grown at low monomer concentration and slow injection volume. Then, the monomer concentration is abruptly increased to cause the teardrop to elongate. Put another way, rods are first formed and then they become rounded (e.g., due to ripening), forming the body of the tear. Then, when the monomer concentration increases, the droplet elongates.

More specific examples of embodiments of the invention can be described with respect to the foregoing examples.

EXAMPLES

A. Synthesis of CdSe Nanocrystal Particles

Dimethylcadmium ($Cd(CH_3)_2$, 97%) and tri-n-butylphosphine ($C_{12}H_{27}P$ or TBP, 99%) were purchased from Strem. $Cd(CH_3)_2$ was vacuum transferred and stored at −35° C. under argon. Selenium (Se) (99.999%), tri-n-octylphosphine oxide ($C_{24}H_{51}OP$ or TOPO, 99%), and hexylphosphonic dichloride (C$_6$H$_{13}$Cl$_2$OP, 95%) were purchased from Aldrich. All solvents used were anhydrous, purchased from Aldrich and used without any further purification. Hexylphosphonic acid (C$_6$H$_{15}$O$_3$P or HPA) was prepared from hexylphosphonic dichloride according to a standard procedure (Andriano.Ka et al., *Zhurnal Obshchei Khimii*, 40:1565-& (1970)).

All manipulations were performed using standard air-free techniques. For the synthesis of CdSe nanocrystal particles, cadmium and selenium precursors were co-dissolved in tri-n-butyl phosphine and the resulting stock solution was stored in a refrigerator at −20° C. The solution was quickly removed from the refrigerator and vigorously agitated for 10 seconds. It was then manually injected, under Ar, via a syringe, into 4 grams of a hot (360° C.) binary surfactant mixture of TOPO and HPA. Unless otherwise stated, the above techniques were used in all of the following syntheses.

Various stock solutions were all made in a glove box under Ar. For stock solution A (molar ratio of Cd:Se of 1.4:1), 0.82 g Cd(CH$_3$)$_2$, 1.6 g Se:TBP (20% Se by weight) and 14.08 g TBP were stirred for 5 minutes and then placed in a refrigerator at −20° C. Stock solution B had a ratio of Cd:Se of 1:1 and was made from 0.82 g Cd(CH$_3$)$_2$, 2.27 g Se:TBP (20% Se by weight), and 13.41 g TBP. Stock solution C had a ratio of Cd:Se of 1.9:1 and was made from 0.82 g Cd(CH$_3$)$_2$, 1.20 g Se:TBP (20% Se by weight), and 14.48 g TBP. These stock solutions were used to create tetrapod, branched tetrapod, teardrop, and arrow shaped nanocrystal particles.

1. Surfactant Ratio Experiments

For the low HPA concentration experiment, 3.88 g of TOPO and 0.12 g HPA were mixed in a 3-neck flask under Ar, and then heated to 360° C. with constant stirring. This mixture is 3% HPA by weight and 8% by molar concentration. The medium concentration experiment was 8% HPA by weight (20% molar), and used 3.68 g TOPO and 0.32 g HPA. The high concentration experiment was 20% HPA by weight (58% molar), and used 3.20 g TOPO and 0.80 g HPA. Henceforth, all concentrations of HPA in TOPO are given in molar concentrations (based on the total amount of HPA and TOPO surfactant), unless otherwise stated. For each of these experiments, 2.0 ml of stock solution A was injected into solution at a rate of approximately 20 ml/s. Aliquots were taken at 4, 10 and 30 minutes after the injection. The reactions were stopped after 30 minutes by quenching the solution with toluene. These experiments were repeated three times each. The temperature drop observed during rod experiments was from 360° C. to ~300° C. and the temperature was maintained at 300° C. unless otherwise stated.

2. Ripening Experiment

To form teardrop-shaped nanocrystal particles, a 1.0 ml of stock solution of A was injected into 20% HPA in TOPO at 360° C. at a rate of 10 ml/s. The temperature was kept at 328° C. The high temperature and low monomer concentration promoted Ostwald ripening of the nanocrystal particles. An additional slow injection of 2.0 ml of stock solution A was started after one minute. This injection took 4 minutes. The synthesis was stopped 20 minutes after completing the slow injection.

3. Shape Selective Dissolution and Precipitation

When the syntheses described above yielded monodisperse samples (both size and shape), no further size selection was applied. If a distribution of lengths and shapes was observed, the following procedure was used to separate them. Methanol was added to the nanocrystal solution until the nanocrystal particles all precipitated. This precipitate was washed twice with methanol to remove residual TOPO, TBP and HPA and was redissolved in toluene. This solution was centrifuged for 30 minutes. If a precipitate (1) appeared at the bottom of the vial, the supernatant (2) was transferred in another vial and the precipitate (1) was dissolved in chloroform. This solution (1) contained the longest rods. In the case of long rods (40 nm or longer), not all the precipitate was soluble in chloroform and the dispersion became clear after the addition of a small amount of dodecylamine (1-2 mg for a 100 mg precipitate). To the supernatant (2), methanol was added drop-wise while under constant agitation, until the solution became cloudy. The solution was then centrifuged and the precipitate (3) was dissolved in toluene or chloroform. This procedure was repeated obtaining tetrapods and short rods in each subsequent precipitate. In all of the above cases, the final product is filtered through a 0.2 um PTFE filter to remove any non-nanoscale materials that might be present.

4. Characterization of Samples.

a. UV-Vis Absorption Spectroscopy

Absorption spectra were created using a Hewlett Packard 8453 UV-visible diode array spectrometer equipped with a deuterium lamp having a resolution of 2.0 nm. A small amount of sample (~10 μl) was removed via syringe and diluted to an optical density of between 0.1 and 0.5 by addition of either toluene or chloroform. The exciton peak in the absorption spectrum taken immediately after injection is broad and between 600-620 nm. If monitored throughout the growth, the exciton peak blue-shifts to around 560 nm and then narrows. This happens because upon injection, there is a broad size distribution of rod lengths. As the rods grow longer, the long axis grows beyond the confinement regime, and the exciton peak only depends on the short axis (diameter) of the rods. Unlike typical nanocrystal syntheses where the peak red-shifts as the size increases, the rods blue-shift. As the length increases beyond the confinement regime, the exciton peak is only dependent on the short axis. The short axis (3-4 nm) is smaller than the rods were initially long, so the exciton peak blue shifts even though the rods increase in length.

b. Transmission Electron Microscopy

Nanocrystal size, morphology and structure were measured by TEM at the National Center for Electron Microscopy at Lawrence Berkeley Laboratory, on a Topcon EM002B electron microscope. The microscope was operated at an accelerating voltage of 120 kV to minimize beam damage to the sample.

Nanocrystal particles were deposited from dilute solution onto a 3-4 nm thick film of amorphous carbon supported by 400 mesh copper grids. One drop of nanocrystal solution in either toluene or chloroform was deposited onto the grid and allowed to evaporate. The sample was then washed with methanol to remove excess organic compounds and placed in a vacuum dessicator overnight.

Structural determination and observation of stacking faults was accomplished using high resolution TEM (HR-TEM) at 440,000 times magnification. Average sizes and morphologies were measured at 88,000 times magnification, calibrated using known crystal lattice spacings measured at higher magnifications. Average lengths and shape distributions were determined by counting at least 300 nanocrystal particles per sample for statistical purposes.

c. Powder X-Ray Diffraction

Powder X-ray diffraction was performed on a Bruker-AXS D8 general area detector diffraction system (GADDS), using Co Kα radiation (1.79026 Å). Two-dimensional patterns were angle integrated to obtain the patterns displayed.

The instrument resolution is 0.07° in 2θ and the accumulation time for each sample was at least 20 minutes. The 2θ range used was from 20°-65° (Q=1.5-4.0 Å$^{-1}$, Q=(4πsin θ)/λ) at an Ω angle of 15°. XRD samples were prepared by evaporating several drops of a nanocrystal solution on a quartz plate. Prior to the measurements, the samples were washed with methanol to remove excess organic material and dried.

XRD sizing of particles was performed using the Debye-Scherrer equation (Guinier, A. *X-Ray Diffraction In Crystals, Imperfect Crystals*, and *Amorphous Bodies*; Dover: N.Y., 1994). The (002) peak at Q=1.8 Å$^{-1}$ was used to determine the length of the crystalline domain along the long axis of the rods. Peaks were fit using commercial software (PeakFit™ v4) utilizing a Gaussian*Lorentzian peak shape. The instrument broadening was measured using bulk LaB$_6$, and then subtracted using a standard correction (Guinier, A. *X-Ray Diffraction In Crystals, Imperfect Crystals*, and *Amorphous Bodies*; Dover: N.Y., 1994) to the Debye-Scherrer equation.

5. Results

For fixed injection conditions, variations of the TOPO/HPA ratio systematically controls the nanocrystal shape. This is clearly seen in the low-resolution TEM image in FIG. 5 and in Table 1.

TABLE 1

| HPA Concentration (molar) | Injection Volume (ml) | Length (nm) | Aspect Ratio (c:a) |
|---|---|---|---|
| 8% | 2.0 | 5.1 ± 0.8 | 1:1 |
| 20% | 2.0 | 21.8 ± 4.2 | 5:1 |
| 60% | 2.0 | 21.7 ± 2.0 | varies |
| 20% | 1.0 | 13.0 ± 2.1 | 2:1 |
| 20% | 1.5 | 16.4 ± 1.1 | 2.7:1 |
| 20% | 2.0 | 21.8 ± 4.2 | 5:1 |

Figure 5:
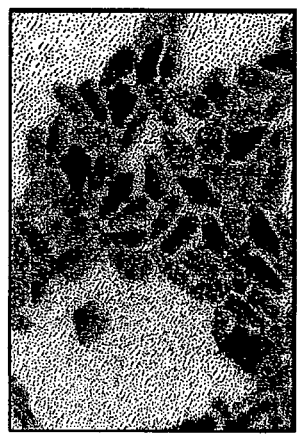
FIG. 5 shows a transmission electron micrograph (TEM) of nanocrystal particles made using 60% HPA in TOPO. Arrow-shaped nanocrystal particles are shown.
Figure 6B:
Figure 6C:
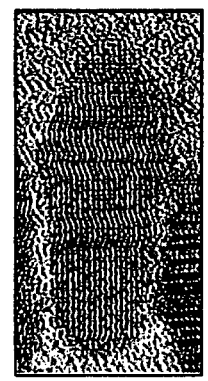

With no HPA and at low concentrations of HPA (less than 10%), roughly spherical dots are formed. At HPA concentrations of 20%, high aspect ratio rod growth is strongly favored. Finally, if the HPA concentration is ~60%, nanocrystal particles shaped like arrows are obtained (FIG. 5 and FIG. 6(*a*)). The inventors observed nanocrystal particles that looked like narrow arrows (FIG. 5). The time dependence of the shape composition of the nanocrystal particles and the average lengths is given in Table 2.

TABLE 2

| Time (min) | Length (nm) | Rod/Pencil | Arrow |
|---|---|---|---|
| 4 | 21.7 ± 2.0 | 56% | 44% |
| 10 | 27.4 ± 3.0 | 37% | 63% |
| 30 | 31.6 ± 3.4 | 35% | 65% |

The amount of arrow shaped nanocrystal particles increases with time as the amount of rod and pencil shaped nanocrystal particles decrease. The average lengths of the long axis (c-axis) of the different shapes of particles within each sample are within 2% of each other.

6. Teardrops

Figure 8A:
FIGS. 8(a)-8(c) show transmission electron micrographs (TEMs) of (FIG. 8(a)) typical teardrop shaped nanocrystal particles. A high resolution TEM (HRTEM) image (FIG. 8(b)) shows the wurtzite structure of particles that are teardrop shaped.
Figure 8B:
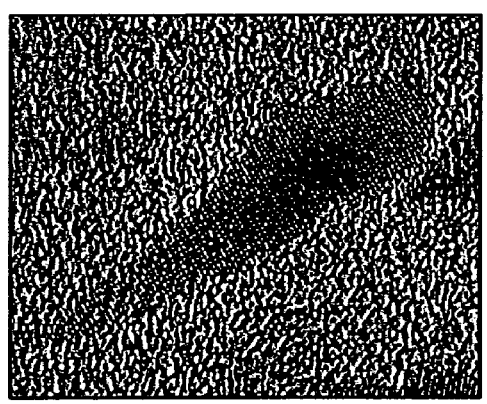
Figure 8C:
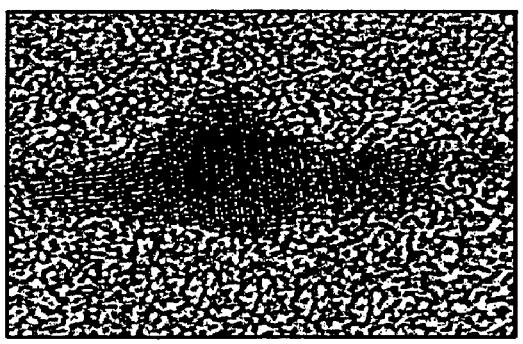

From FIGS. 8(*a*)-8(*b*), it appears that particle growth occurs selectively on one crystal face of the rods, thus forming almost teardrop-shaped particles. There are exceptions as can be seen in FIG. 8(*c*), which shows a particle with growth occurring on two faces. Characterizing these cases with HRTEM revealed that they represent nanocrystal particles with largely zinc blende structure, a defect, or a combination of the two. All crystals that were pure wurtzite grew significantly more on the (00$\bar{1}$) face of the nanocrystal, forming teardrops.

7. Tetrapods

Figure 9A:
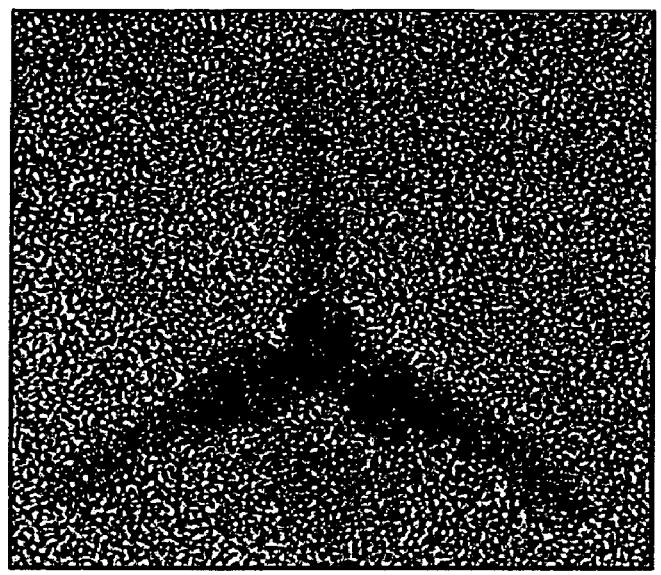
FIGS. 9(a)-9(b) show high resolution transmission electron microscope (HRTEM) images of tetrapod nanocrystal particles.
Figure 9B:
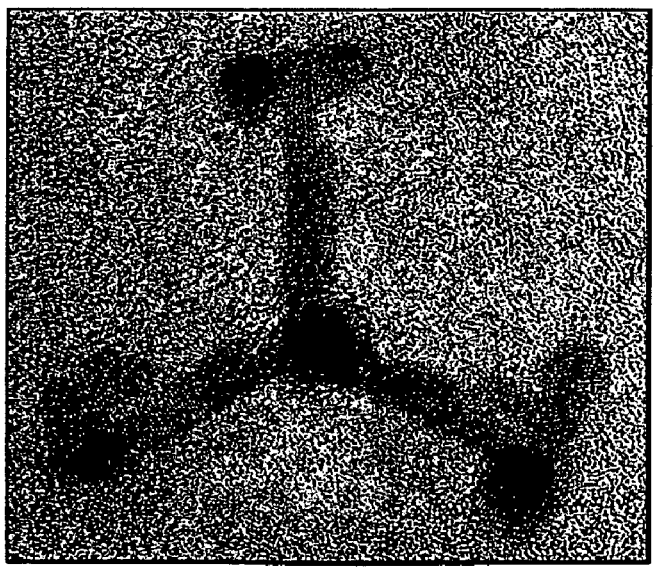

Another nanocrystal shape that can be consistently obtained is tetrapod nanocrystal particles as seen in FIG. 9(*a*). There are lattice fringes throughout the crystal, indicating crystallinity in both the center and the arms. If tetrapods are observed in a synthesis that leads to rod formation, they can be selected out via size/shape selective precipitation as detailed above. There is a relationship between a particles size and shape, and its solubility. In general, the larger the particle, the less soluble it is (assuming the same coating by surfactant). If there is a mixture of tetrapods with arms as long as the rods, and rods, then the tetrapods are less soluble and will precipitate before the rods.

When performing additional injections into solutions containing tetrapods, "dendritic" tetrapods can be formed as seen in FIG. 9(*b*). Up to three additional "branches" can be grown off the end of each arm of the original tetrapod.

Figure 7:
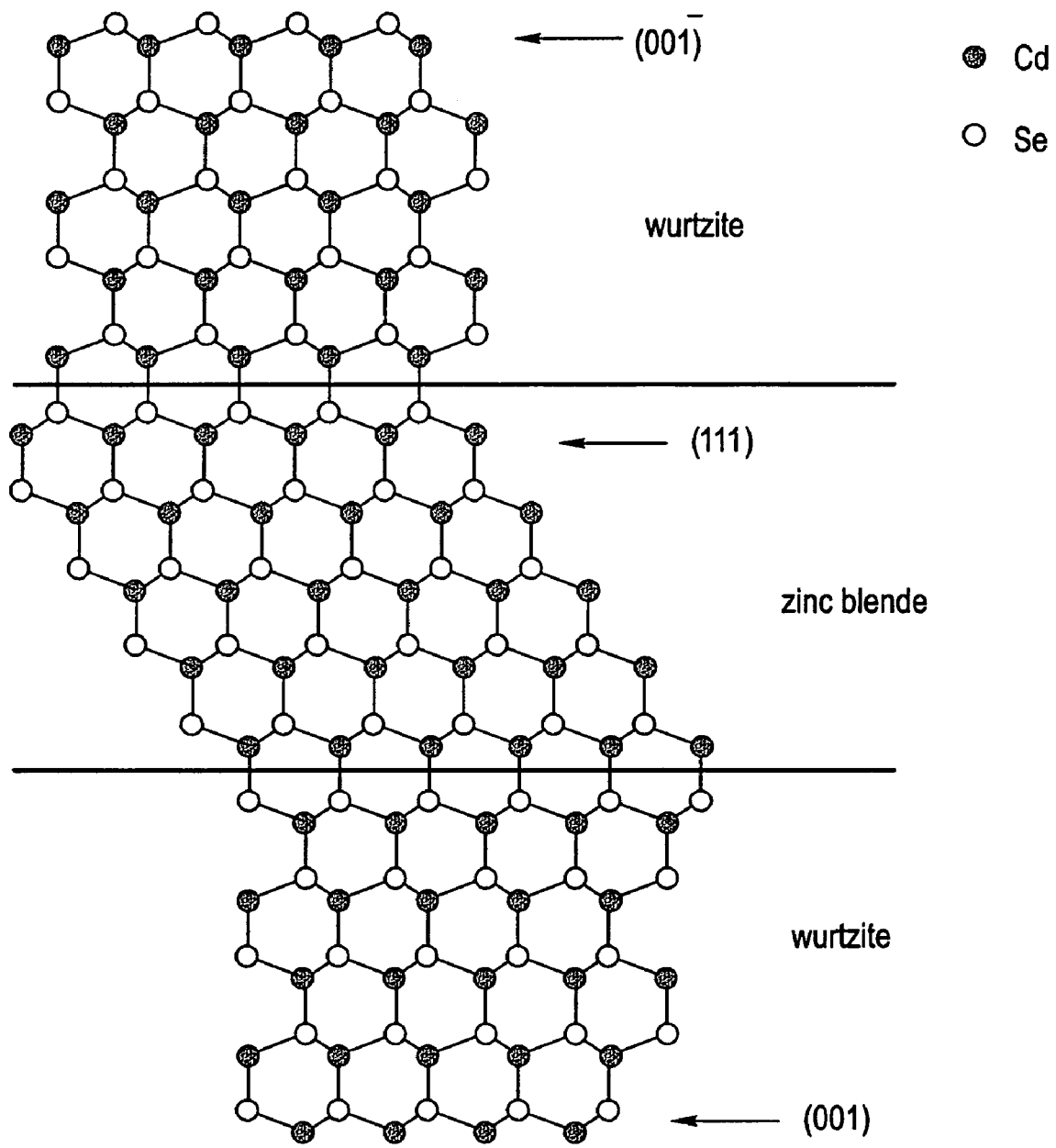
FIG. 7 shows a 2-dimensional representation showing the relationship between the wurtzite and zinc blende structures. Wurtzite has ABAB stacking while zinc blende has ABCABC stacking. The (111) face of zinc blende and the (00$\bar{1}$) face of wurtzite both have planes alternately composed of Cd and Se atoms. The two structures are related by a stacking fault.
Figure 11:
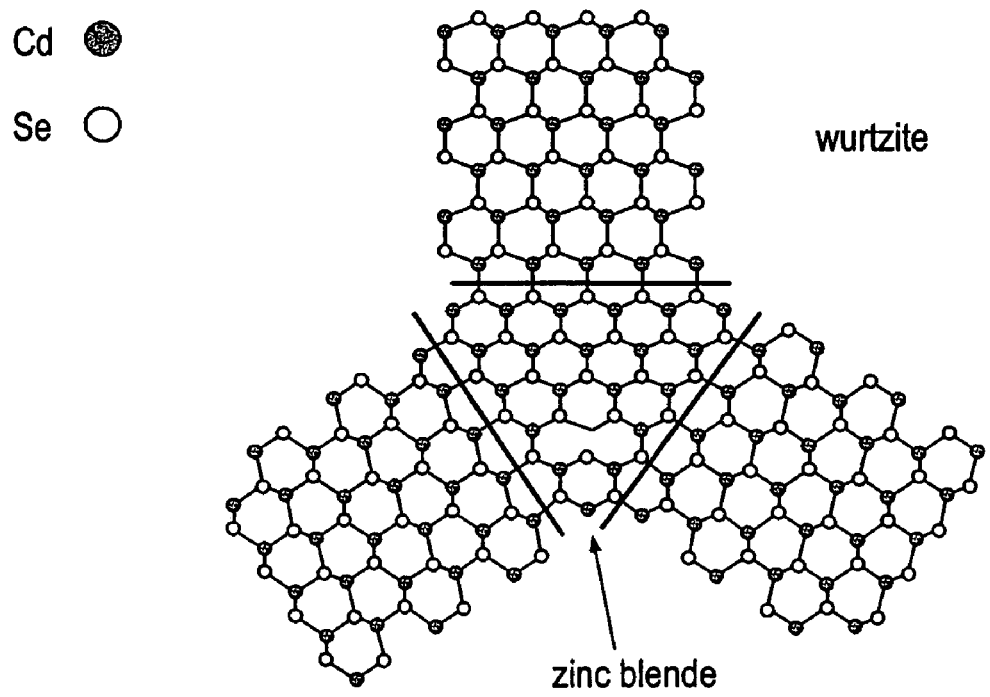
FIG. 11 shows a 2-dimensional representation showing the structure of a tetrapod. The nuclei is the zinc blende structure, with wurtzite arms growing out of each of the four (111) equivalent faces. Three are shown, with the fourth coming out of the page towards the reader.

As noted, tetrapods are single-crystal particles that demonstrate polytypism, having a tetrahedral zinc blende core and four wurtzite arms. Like the {001} planes of the wurtzite structure, the {111} planes of the zinc blende structure contain layers alternately composed of either Cd or Se as can be seen in FIG. 7. Since the presence of HPA selectively increases the growth rate of the (00$\bar{1}$) face, it follows that the closely related zinc blende {111} faces would also grow quickly in this binary surfactant mixture. The tetrapods are formed when a CdSe nanocrystal nucleates in the zinc blende structure instead of the wurtzite structure. Then, wurtzite arms grow out of the four (111) equivalent faces of the tetrahedral zinc blende core as seen in FIG. 11. As noted above, there may be several ways of selectively adjusting the relative amounts of zinc blende versus wurtzite nuclei formed in the injection process.

More complex shapes, such as dendritic tetrapods, are produced by performing additional slow injections of monomer into a solution already containing tetrapods. Growth occurs at the ends of the tetrapod arms with each additional injection. If the arms are purely wurtzite, they will continue to grow straight. If there are zinc blende layers or stacking faults near the end of the arms, which is a statistical probability, multiple (up to 3 maximum) additional "branches" will grow out of each arm. This can be clearly seen in FIG. 9(*b*), where a second precursor injection was been performed on a sample containing tetrapods after the monomer concentration was allowed to decrease thereby encouraging the formation of zinc blende layers at the end of the tetrapod arms.

B. Synthesis of CdTe tetrapods

1. Materials

Cadmium oxide (CdO) (99.99+%), Tellurium (Te) (99.8%, 200 mesh), and tri-n-octylphosphine oxide (C$_{24}$H$_{51}$OP or TOPO, 99%) were purchased from Aldrich. n-Octadecylphosphonic acid (C$_{18}$H$_{39}$O$_3$P or ODPA, 99%) was purchased from Oryza Laboratories, Inc. Trioctylphosphine (TOP) (90%) was purchased from Fluka. All solvents used were anhydrous, purchased from Aldrich, and used without any further purification.

2. Synthesis of CdTe Tetrapods

All manipulations were performed using standard air-free techniques. The Cd/Te molar ratio was varied from 1:1 to 5:1, and the Cd/ODPA molar ratio was varied from 1:2 to 1:5. The Te precursor solution was prepared by dissolving tellurium powder in TOP (concentration of Te 10 wt. %). The mixture was stirred for 30 minutes at 250° C. then cooled and centrifuged to remove any remaining insoluble particles. In a typical synthesis of CdTe tetrapods, a mixture of ODPA, TOPO, and CdO was degassed at 120° C. for 20 minutes in a 50 ml three-neck flask connected to a Liebig condenser. It was heated slowly under Ar until the CdO decomposed and the solution turned clear and colorless. Next, 1.5 g of trioctyl phosphine (TOP) was added and the temperature was further raised to 320° C. After that, the Te:TOP precursor solution was injected quickly. The temperature dropped to 315° C. and was maintained at this value throughout the synthesis. All syntheses were stopped after 5 minutes by removing the heating mantle and by rapidly cooling the flask. After cooling the solution to 70° C., 3-4 ml anhydrous toluene were added to the flask, and the dispersion was transferred to an Ar drybox. The minimum amount of anhydrous methanol, which was used to precipitate the nanocrystal particles after centrifugation, was added to the dispersion. In this way, potential co-precipitation of the Cd-phosphonate complex was prevented. After removing the supernatant, the precipitate was re-dissolved twice in toluene and re-precipitated with methanol. After removing the supernatant, the final precipitate was stored in the drybox. All resulting CdTe tetrapods were readily soluble in solvents such as chloroform or toluene.

3. Characterization of Samples by Transmission Electron Microscopy (TEM) and UV-Vis Absorption Spectroscopy.

The structure and size of the CdTe nanocrystal particles were measured via TEM. At the UC Berkeley Electron Microscope Lab, a FEI Tecnai 12 electron microscope was used. The microscope was operated at an accelerating voltage of 100 kV. To evaluate the growth kinetics of the syntheses, a small amount of the sample (~0.1 ml) was removed via syringe from the flask every minute and mixed into anhydrous toluene. The aliquots were transferred to the drybox and washed once with methanol. The precipitated nanocrystal particles were re-dissolved in toluene and deposited from dilute solution onto a 3-4 nm thick film of amorphous carbon supported by 400 mesh copper grids. One drop of nanocrystal solution in toluene was deposited onto the grid and evaporated. UV-Vis absorption spectra were measured using a Hewlett-Packard 8453 UV-visible diode array spectrometer equipped with a deuterium lamp having a resolution of 1.0 nm.

4. Table of Syntheses

Table 4 shows reagent amounts in CdTe tetrapod syntheses. (In order to compensate for losses during injection, the recorded amount of Te:TOP slightly exceeds the one corresponding to the cited Cd/Te ratio.)

TABLE 4

| | | | Cd/Te molar ratio | | | |
|---|---|---|---|---|---|---|
| | | | 1:1 | 2:1 | 3:1 | 5:1 |
| Cd/ODPA molar ratio | 1:2 | TOPO [g] | 3.83 | 3.469 | 3.19 | 3.19 |
| | | ODPA [g] | 0.27 | 0.531 | 0.81 | 0.81 |
| | | CdO [g] | 0.051 | 0.102 | 0.153 | 0.153 |
| | | Te:TOP [g] | 0.540 | 0.540 | 0.540 | 0.350 |
| | 1:3 | TOPO [g] | 3.73 | 3.20 | 3.19 | 3.19 |
| | | ODPA [g] | 0.27 | 0.80 | 0.81 | 0.81 |
| | | CdO [g] | 0.035 | 0.102 | 0.102 | 0.102 |
| | | Te:TOP [g] | 0.400 | 0.540 | 0.400 | 0.240*) |
| | 1:5 | TOPO [g] | 3.544 | 2.67 | 2.65 | 2.65 |
| | | ODPA [g] | 0.456 | 1.33 | 1.35 | 1.35 |
| | | CdO [g] | 0.035 | 0.102 | 0.102 | 0.102 |
| | | Te:TOP [g] | 0.400 | 0.540 | 0.400 | 0.240*) |

*)0.100 g TOP additionally injected.

Figure 12:
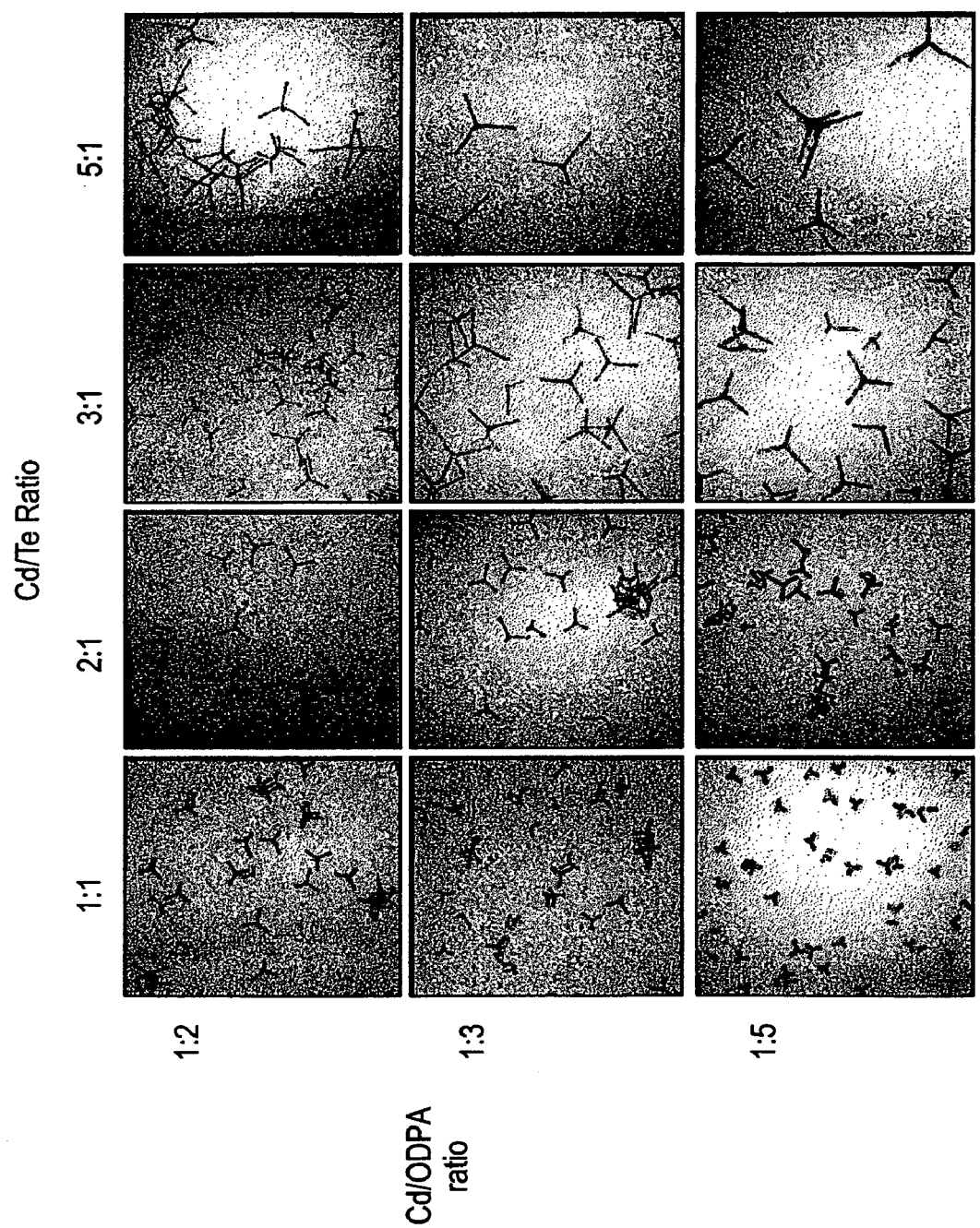
FIG. 12 shows transmission electron micrographs (TEMs) of CdTe tetrapods grown under various reaction conditions.

Beyond control of the phase during nucleation and growth, manipulation of the growth kinetics enables independent tuning of the arm lengths and diameters. FIG. 12 shows a series of transmission electron microscopy (TEM) images of typical CdTe tetrapods of various lengths and aspect ratios, illustrating the influence of the main growth parameters on shape. The present inventors found that once the basic tetrapod shape is formed, growth of the arms occurs according to the controllable kinetic mechanisms previously observed for nanorods.

In the CdTe tetrapod syntheses, the Cd/Te ratio was varied from 1:1 to 5:1, and the Cd/ODPA ratio was varied from 1:2 to 1:5 (the Cd/OPDA ratio was 1:2 and was at maximum in order for the CdO to decompose completely). An increase in the Cd/Te ratio leads to tetrapods with longer arms, whereas higher Cd/ODPA ratios result in larger arm diameters. In all the experiments, the amount of Te:TOP solution injected was adjusted with respect to the Cd/Te ratio. Also, the amount of ODPA added varied depending on the Cd/OPDA ratio. The total amount of TOPO+ODPA was always equal to 4 grams. For the syntheses done at Cd/ODPA ratio of 1:2, the amount of CdO initially dissolved in the TOPO/ODPA mixture was 51 mg (1:1 Cd/Te), 102 mg (2:1 Cd/Te), and 153 mg (for both 3:1 and 5:1 Cd/Te), respectively. For the syntheses done at Cd/ODPA ratios of 1:3 and 1:5, the amounts of CdO initially dissolved in the TOPO/ODPA mixture are 35 mg (1:1 Cd/Te) and 102 mg (for 2:1, 3:1 and 5:1 Cd/Te), respectively. Avoiding a large temperature drop after the injection of the Te:TOP solution is desirable to ensure both a faster recovery of the thermal equilibrium between the flask and the heating mantle and a higher homogeneity and reproducibility of the reaction conditions.

Figure 13:
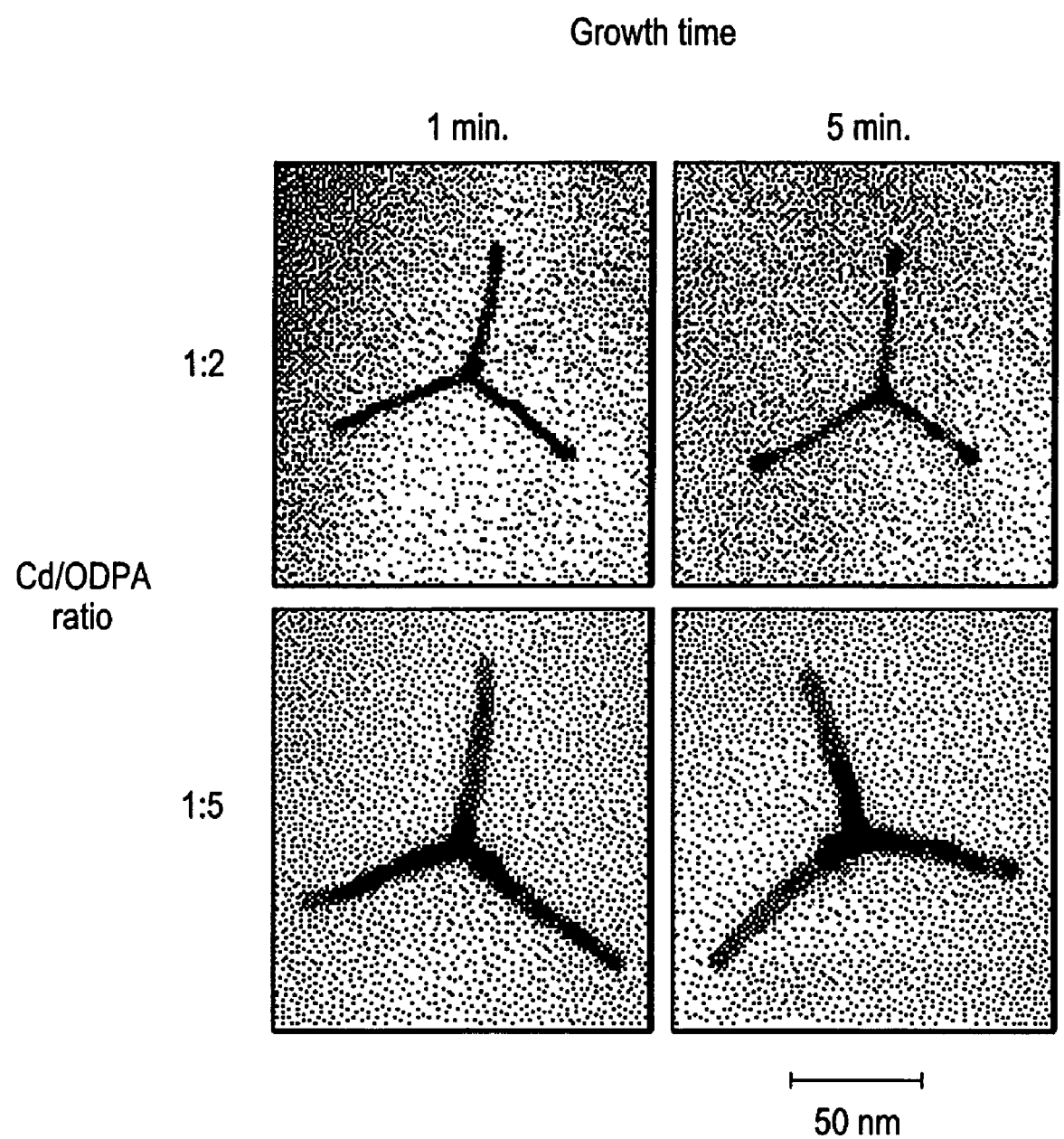
FIG. 13 shows TEMs of CdTe tetrapods extracted from the same synthesis at 1 and at 5 minutes, respectively, for two syntheses carried out at the same Cd/Te ratio (5:1), but at two different Cd/ODPA ratios (1:2 and 1:5).

A further consequence of the kinetically controlled growth appears in the shape evolution of tetrapods beyond the anisotropic growth regime. In FIG. 13, CdTe tetrapods extracted from the same synthesis, at 1 and at 5 minutes, respectively, for two syntheses carried out at the same Cd/Te ratio, but at two different Cd/ODPA ratios, are compared. In both cases, most of the anisotropic growth takes place in the first minute after injection, when the concentration of monomers is high. The facet growing most quickly during this period is the one with the highest interfacial energy. However, when the concentration of monomer drops, this facet is also the one that starts dissolving first. For instance, at high (1:2) Cd/ODPA ratio, the tetrapods grown for 5 minutes have distinctly rounded ends. The dissolution of the end of an arm (the (000$\bar{1}$) facet) increases the local monomer concentration, allowing the lateral facets to grow at its expense, resulting in round, fat ends of the arms. This effect is not apparent in the sample grown at a lower (1:5) Cd/ODPA ratio, since slower growth rate delays the Ostwald ripening regime to longer times.

FIG. 14 shows a typical powder X-ray diffraction (XRD) of a CdTe tetrapod sample (non-vertical line with peaks). The bulk XRD pattern of CdTe wurtzite is also shown (vertical lines). The 002 peak is very narrow and more intense than the other peaks because of the extended domain along the c axis of the tetrapod arms.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

All patents, patent applications, and publications mentioned above are herein incorporated by reference in their entirety for all purposes. None of the patents, patent applications, and publications mentioned above are admitted to be prior art.

What is claimed is:

1. A nanocrystal particle made by a process comprising:
   (a) providing a core having a first crystal structure in a solution; and
   (b) forming an arm extending from the core having a second crystal structure in the solution.

2. A photovoltaic device comprising the nanocrystal particle of claim 1.

3. A nanocrystal particle made by a process comprising:
   introducing semiconductor nanocrystal particle precursors into a heated mixture of surfactants capable of promoting the growth of tetrapod shaped semiconductor nanocrystal particles; and
   forming the tetrapod shaped semiconductor nanocrystal particle.

4. A nanocrystal particle comprising:
   a core having a first crystal structure; and
   at least an arm extending from the core having a second crystal structure.

5. The nanocrystal particle of claim 4 wherein the arm is a first arm, and wherein the nanocrystal particle further comprises:
   at least a second arm extending from the core, the second arm having the second crystal structure.

6. The nanocrystal particle of claim 4 wherein the arm is a first arm, and wherein the nanocrystal particle further comprises:
   at least a second arm extending from the core, the second arm having the second crystal structure; and
   at least a third arm extending from the core, the third arm having the second crystal structure.

7. The nanocrystal particle of claim 4 wherein the arm is a first arm, and wherein the nanocrystal particle further comprises:
   at least a second arm extending from the core, the second arm having the second crystal structure;
   at least a third arm extending from the core, the third arm having the second crystal structure; and
   at least a fourth arm extending from the core, the fourth arm having the second crystal structure.

8. The nanocrystal particle of claim 4 further comprising amphiphilic molecules bound to the surfaces of the arm.

9. The nanocrystal particle of claim 4 further comprising second, third, and fourth arms extending from the core, wherein the nanocrystal particle is a tetrapod shaped nanocrystal particle.

10. The nanocrystal particle of claim 4 wherein the core and the arm comprise a compound semiconductor.

11. The nanocrystal particle of claim 4 wherein the core is a first core, and wherein the arm is a first arm that has a proximate end proximate the first core and a distal end distal to the first core, and wherein the particle further comprises:
    a second core at the distal end of the first arm and additional arms extending from the second core.

12. The nanocrystal particle of claim 4 wherein the first crystal structure is a zinc-blende crystal structure, and the second crystal structure is a wurtzite crystal structure.

13. The nanocrystal particle of claim 4 wherein the core has a diameter from about 3 to about 4 nanometers and the arm has a length of from about 4 to about. 100 nanometers.

14. The nanocrystal particle of claim 4 wherein the core and the arm comprise CdTe.

15. A photovoltaic device comprising the nanocrystal particle of claim 4.

16. A branched nanocrystal particle comprising:
    a core;
    at least a first arm extending from the core; and
    at least a second arm extending from the core, wherein the second arm forms a branch with respect to the first arm, and
    wherein the core, the first arm, and the second arm comprise a Group II-VI or a Group III-V semiconductor.

17. The branched nanocrystal particle of claim 16 further comprising:
    a third arm extending from the core, and a fourth arm extending from the core, wherein the first, second, third, and fourth arms, and the core form a tetrapod.

18. The branched nanocrystal particle of claim 16 wherein the core is a first core, and wherein the first arm includes a proximate end proximate to the first core and a distal end distal to the first core, and wherein the branched nanocrystal particle further comprises:
    a second core at the distal end of the first nanocrystal particle; and
    additional arms extending from the second core.

19. The branched nanocrystal particle of claim 16 further comprising a surfactant molecule attached to the core, the first arm, or the second arm.

20. The branched nanocrystal particle of claim 16 wherein the core has a diameter of about 3 nm to about 4 nm, and wherein each of the first and second arms have a length from about 4 nm to about 100 nm.

21. The branched nanocrystal particle of claim 16 wherein the Group II-VI or Group III-V semiconductor comprises CdSe or CdTe.

22. The branched nanocrystal particle of claim 16 wherein the core has a first crystal structure and wherein the first and second arms have a second crystal structure.

23. The branched nanocrystal particle of claim 16 wherein the core has a zinc blende crystal structure and wherein the first and second arms have a wurtzite crystal structure.

24. A tetrapod shaped nanocrystal particle comprising:
    a core having a first crystal structure;
    a first arm extending from the core;
    a second arm extending from the core;
    a third arm extending from the core; and
    a fourth arm extending from the core, wherein the first, second, third, and fourth arms have a second crystal structure,
    wherein the first crystal structure is different than the second crystal structure.

25. The tetrapod shaped nanocrystal particle of claim 24 wherein the tetrapod shaped nanocrystal comprises a compound semiconductor.

26. The tetrapod shaped nanocrystal particle of claim 24 wherein the tetrapod shaped nanocrystal comprises a compound semiconductor selected from the group consisting of CdTe and CdSe.

27. The tetrapod shaped nanocrystal particle of claim 24 wherein the core has a diameter from about 3 to about 4 nanometers and wherein the first, second, third, and fourth arms each have a length of from about 4 to about 100 nanometers.

28. The tetrapod shaped nanocrystal particle of claim 24 wherein first crystal structure is a cubic crystal structure and the second crystal structure is a hexagonal crystal structure.

29. The tetrapod shaped nanocrystal particle of claim 24.wherein first crystal structure is a zinc blende crystal structure and the second crystal structure is a wurtzite crystal structure.

30. The tetrapod shaped nanocrystal particle of claim 24 wherein first crystal structure is a zinc blende crystal structure and the second crystal structure is a wurtzite crystal structure.

31. The tetrapod shaped nanocrystal particle of claim 24 comprising a metal.

32. The tetrapod shaped nanocrystal particle of claim 24 further comprising a surfactant molecule bound to at least one of the first, second, third, or fourth arms.

33. The tetrapod shaped nanocrystal particle of claim 24 wherein each of the first, second, third, and fourth arms has an aspect ratio greater than about 1.0.

34. The tetrapod shaped nanocrystal particle of claim 24 wherein the first, second, third, and fourth arms each have substantially the same length.

35. A photovoltaic device comprising:

the tetrapod shaped nanocrystal particle of claim 24.

36. A nanocrystal particle in the form a teardrop or an arrow.

37. The nanocrystal particle of claim 36 wherein the nanocrystal particle comprises CdTe or CdSe.

38. The nanocrystal particle of claim 36 wherein the nanocrystal particle comprises a Group III-V or a Group II-VI semiconductor.

* * * * *

UNITED STATES PATENT AND TRADEMARK OFFICE
CERTIFICATE OF CORRECTION

PATENT NO.         : 7,311,774 B2                                   Page 1 of 1
APPLICATION NO. : 10/980472
DATED              : December 25, 2007
INVENTOR(S)        : A. Paul Alivisatos et al.

It is certified that error appears in the above-identified patent and that said Letters Patent is hereby corrected as shown below:

Title page, item [75]
Please correct inventors name from "Eric C. Sher" to --Erik C. Scher--.

Signed and Sealed this

Thirteenth Day of May, 2008

JON W. DUDAS
*Director of the United States Patent and Trademark Office*